United States Patent [19]
Shimada et al.

[11] Patent Number: 5,726,990
[45] Date of Patent: Mar. 10, 1998

[54] MULTIPLEXER AND DEMULTIPLEXER

[75] Inventors: Masaaki Shimada; Norio Higashisaka, both of Tokyo, Japan

[73] Assignee: Mitsubishi Denki Kabushiki Kaisha, Tokyo, Japan

[21] Appl. No.: 629,148

[22] Filed: Apr. 8, 1996

[30] Foreign Application Priority Data

Aug. 10, 1995 [JP] Japan .................. 7-204577

[51] Int. Cl.$^6$ .................................... H03M 9/00
[52] U.S. Cl. .................. 370/536; 370/540; 341/100; 341/101; 327/407; 327/415
[58] Field of Search ................... 370/532–545; 341/100, 101; 327/407, 415; 395/891; 364/239.2, 939.5

[56] References Cited

U.S. PATENT DOCUMENTS

| | | | |
|---|---|---|---|
| 4,377,806 | 3/1983 | Elliott | 340/347 DD |
| 5,345,449 | 9/1994 | Buckingham | 370/100.1 |
| 5,526,361 | 6/1996 | Hedberg | 370/105.3 |

FOREIGN PATENT DOCUMENTS

| | | |
|---|---|---|
| 62-137934 | 6/1987 | Japan . |
| 287829 | 3/1990 | Japan . |
| 522157 | 1/1993 | Japan . |
| 6283984 | 10/1994 | Japan . |
| 6350416 | 12/1994 | Japan . |

*Primary Examiner*—Douglas W. Olms
*Assistant Examiner*—Matthew C. Phillips
*Attorney, Agent, or Firm*—Leydig, Voit & Mayer, Ltd.

[57] ABSTRACT

A multiplexer includes an n-th stage as a final output stage ($n$=integer, $2 \leq n$); j stages ($j$=integer, $1 \leq j \leq n-1$), the n-th stage including a D flip-flop having a clock input terminal for receiving a first clock signal, a data input terminal for receiving serial data, and a data output terminal, the D flip-flop synchronizing the clock signal with the serial data; and a j-th stage including $m^{n-j-1}$ ($m$=integer, $2 \leq m$) multiplexer blocks, each multiplexer block including D flip-flops and having data input terminals for receiving m parallel data inputs and a clock input terminal for receiving a second clock signal produced by frequency division of the first clock signal, and converting the parallel data into serial data in response to the second clock signal. The multiplexer further includes a variable delay circuit connected to the data input terminal of each multiplexer block in one of the second to the n-th stages for delaying the data input by a variable delay time. Therefore, even when the delay times of the constituents of the circuit vary due to device parameters or temperature, the timing of the data input can be adjusted by the variable delay circuit.

18 Claims, 19 Drawing Sheets

Prior Art

MULTIPLEXER AND DEMULTIPLEXER

FIELD OF THE INVENTION

The present invention relates to a multiplexer for converting parallel data to serial data and a demultiplexer for converting serial data to parallel data and, more particularly, to a multiplexer and a demultiplexer used for high-speed operation.

BACKGROUND OF THE INVENTION

FIG. 19 is a circuit diagram illustrating a prior art multiplexer. In the figure, reference numeral 3a designates an m:1 multiplexer block (hereinafter referred to as MUX block) for converting m (m=integer, $2 \leq m$) parallel data inputs to serial data. The m:1 multiplexer block comprises a number of D flip-flops equal to the input parallel data. Reference numeral 4 designates a D flip-flop for timing control. Reference numeral 5a designates a frequency divider that divides the frequency of an input clock signal to produce an output signal having a frequency that is an exact integral submultiple of the input frequency. The integral submultiple depends on the circuit structure of the m:1 MUX block 3a. Reference numeral 60 designates a parallel data input terminal. Reference numeral 61 designates a serial data output terminal. Reference characters $S_1$ to $S_n$ (n=integer, $2 \leq n$) designate output stages. Reference character CLK designates a high-speed clock. Reference numeral 64 designates a high-speed clock input terminal.

As shown in FIG. 19, the prior art multiplexer comprises the output stages $S_1$ to $S_n$, and the final output stage $S_n$ includes the D flip-flop 4 that synchronizes the serial data output from the previous stage $S_{n-1}$ with the high-speed clock input CLK. The j-th stage $S_j$ (j=integer, $1 \leq j \leq n-1$) includes $m^{n-j-1}$ m:1 MUX blocks 3a for converting the m parallel data, which data are input to the parallel data input terminal 60 when j=1 and are input to the j-th stage $S_j$ from the previous stage $S_{j-1}$ when j>1, into serial data using a clock signal that is obtained by dividing the clock input CLK using the (n-j) frequency dividers 5a. The $m^{n-j-1}$ m:1 MUX blocks 3a in the $S_j$ stage are connected to the next stage so that the serial data output from each m:1 MUX block 3a in the $S_j$ stage becomes one of the parallel data input to the m:1 MUX block 3a in the next stage or becomes serial data input to the D flip-flop 4 in the $S_n$ stage.

In the prior art multiplexer comprising the n output stages, a plurality of parallel data inputs to the input terminal 60 are successively converted into serial data by the m:1 MUX blocks 3a, and serial data is produced at the $S_{n-1}$ stage prior to the final stage. This serial data is synchronized with the clock CLK at the final stage $S_n$ and output from the output terminal 61 as a serial data output.

FIG. 12 is a block diagram for explaining the operating principle of the prior art multiplexer. In the figure, the same reference numerals as those shown in FIG. 19 designate the same or corresponding parts. The multiplexer 200 includes 2:1 MUX blocks 1, 2, and 3 corresponding to the m:1 MUX blocks 3a, ½ frequency dividers 5 and 5b corresponding to the frequency dividers 5a, and a D flip-flop 4. Reference character $SIG_1$ denotes a serial data output from the 2:1 MUX block 3.

Although the multiplexer 200 is a 4:1 multiplexer converting four bit parallel data into serial data, the operating principle is identical even when the bit number of the input parallel data is changed.

FIG. 13 is a block diagram illustrating a circuit structure of the 2:1 MUX blocks 1 to 3 shown in FIG. 12. In FIG. 13, reference numeral 7 designates a D flip-flop, numeral 8 designates a D flip-flop with a phase shifter, and numeral 9 designates a two-input selector. More specifically, the D flip-flop 7 latches the input data and outputs the data synchronously with clocks input to the 2:1 MUX block. The D flip-flop 8 with the phase shifter latches the input data, delays the phase of the data by ½ period of the clock input to the 2:1 MUX block, and outputs the data. The two-input selector 9 selects one of the outputs from the D flip-flops 7 and 8 synchronously with a clock signal.

Assuming that the parallel data input to the D flip-flop 7 and the D flip-flop 8 with the phase shifter are A and B, respectively, the parallel data B input to the D flip-flop 8 is phase-delayed by ½ period from the parallel data A input to the D flip-flop 7 when it is input to the selector 9.

In the selector 9, the parallel data A and the parallel data B are alternatingly selected at intervals equivalent to ½ period of the input clock. In this way, the 2:1 MUX block converts two bit parallel data into serial data. The operation of the m:1 MUX block 3a shown in FIG. 19 is fundamentally identical to the above-described operation although the number of the D flip-flops and the operating timing of the selector are different. More specifically, in the m:1 MUX block, the number of the D flip-flops is m, and one of the m D flip-flops has no phase shifter. That is, the (m-1) D flip-flops delay the phases of the input clocks by 1/m period, 2/m period, . . . , (m-1)/m period, respectively.

A description is given of the prior art multiplexer 200 shown in FIG. 12. The multiplexer 200 comprises the 2:1 MUX blocks 1 to 3, the D flip-flop 4, and the frequency dividers 5 and 5b for dividing the frequency of an input clock to ½. The by 2 frequency dividers 5 and 5b produce a clock ½ CLK having a frequency equivalent to a half of the frequency of the high-speed clock CLK and a clock ¼ CLK having a frequency equivalent to a quarter of the high-speed clock CLK, respectively. The first stage 2:1 MUX blocks 1 and 2 convert four bit parallel data 3, 2, 1, and 0 into two bit parallel data ODD and EVEN in response to the clock ¼ CLK. The second stage 2:1 MUX block 3 converts the two bit parallel data ODD and EVEN into serial data $SIG_1$ in response to the clock ½ CLK. Finally, the D flip-flop 4 synchronizes the serial data $SIG_1$ with the high-speed clock CLK that is directly applied from the outside of the multiplexer 200, and obtained serial data output is output from the multiplexer 200.

FIGS. 14(a)–14(k) show a timing chart of the prior art multiplexer. More specifically, FIGS. 14(a)–14(d) show the timings of the parallel data 3, 2, 1, and 0 input to the multiplexer 200, respectively. FIGS. 14(e), 14(h), and 14(j) show the timings of the clocks ¼ CLK, ½ CLK, and CLK, respectively. FIGS. 14(f) and 14(g) show the timings of the parallel data ODD and EVEN, respectively. FIG. 14(i) shows the timing of the serial data $SIG_1$, and FIG. 14(k) shows the timing of the serial data output from the multiplexer 200. In the figures, ΔTa is a delay time in the frequency divider 5, ΔTb is a delay time in the frequency divider 5b, ΔTc is a delay time in the first stage 2:1 MUX blocks 1 and 2, ΔTd is a delay time in the second stage 2:1 MUX block 3, and ΔTe is a delay time in the D flip-flop 4.

Now, a description is given of the timing of the D flip-flop 4 in the final output stage. FIGS. 18(a)–18(c) show the relationship between a clock input and a data input in the D flip-flop 4. More specifically, FIG. 18(a) shows a clock CLK input, and FIGS. 18(b) and 18(c) show data $SIG_1$ inputs. In the figures, reference characters $T_{su}$ and $T_h$ denote a setup time and a hold time of the D flip-flop 4, respectively.

Reference numeral 19 designates a data $SIG_1$ changing point. In order to operate the D flip-flop 4 with stability, the data should not be changed between the setup time $T_{su}$ and the hold time $T_h$ of the D flip-flop 4, and the data $SIG_1$ should not be changed between the setup time $T_{su}$ and the hold time $T_h$ when the clock CLK rises. For example, as shown in FIG. 18(b), when the data changing point 19 is not present between the setup time $T_{su}$ and the hold time $T_h$, the D flip-flop 4 selects the data A1. However, when the data $SIG_1$ is changed between the setup time $T_{su}$ and the hold time $T_h$ as shown in FIG. 18(c), the D flip-flop 4 becomes unstable in selecting between the data before the data changing point 19 and the data after that point. As a result, the timing of the data output from the D flip-flop 4 varies. As shown in FIGS. 14(a)–14(k), the timing of the clock CLK that is input to the D flip-flop 4 and the timing of the data $SIG_1$ that is obtained using the clock ½ CLK produced by division of the clock CLK are determined by the total of the delay times ΔTa and ΔTd. However, the delay times ΔTa and ΔTd are not always as designed and significantly vary due to variations in process parameters or the temperature of the constituents of the multiplexer circuit, so that the timing of the clock CLK is sometimes deviated from the timing of the data $SIG_1$. Especially when the operating speed is increased, the time interval where the data $SIG_1$ is not changed is shortened, and the timing margin for the setup time $T_{su}$ and the hold time $T_h$ of the D flip-flop 4 is reduced, resulting in difficulty in normally operating the D flip-flop 4.

FIG. 20 is a block diagram illustrating a circuit structure of a prior art demultiplexer. In the figure, reference numeral 13a designates a 1:m demultiplexer block (hereinafter referred to as DEMUX block) for converting serial data into m (m=integer, 2≦m) parallel data outputs. The 1:m demultiplexer block 13a comprises a number of D flip-flops equal to the number of the parallel data outputs. Reference numeral 14 designates a D flip-flop for timing control. Reference numeral 15a designates a frequency divider that divides the frequency of an input clock to produce an output signal having a frequency that is an exact integral submultiple of the input frequency. The integral submultiple depends on the circuit structure of the 1:m DEMUX block 13a. Reference numeral 62 designates a serial data input terminal. Reference numeral 63 designates a parallel data output terminal. Reference characters $S_1$ to $S_n$ (n=integer, 2≦n) designate output stages. Reference character CLK designates a high-speed clock. Reference numeral 65 designates a high-speed clock input terminal.

As shown in FIG. 20, the prior art demultiplexer comprises the output stages $S_1$ to $S_n$, and the first stage S1 includes the D flip-flop 14 that synchronizes the serial data that is input to the input terminal 62 with the high-speed clock CLK. The i-th stage $S_i$ (i=integer, 2≦i≦n (n=integer, 2≦n)) includes $m^{i-2}$ 1:m DEMUX blocks 13a for converting the serial data which is input to the i-th stage $S_i$ from the previous stage $S_{i-1}$ into m (2≦m) parallel data outputs using a clock signal that is obtained by dividing the clock input CLK using the (i-1) frequency dividers 5a. The $m^{i-2}$ 1:m DEMUX blocks 13a of the $S_i$ stage are connected to the previous stage so that the serial data output from the previous D flip-flop 14 or one of the parallel data output from the 1:m DEMUX block 13a of the previous stage is input to the 1:m DEMUX block 13a in the $S_i$ stage as serial data.

In the prior art demultiplexer comprising the n output stages, serial data input to the input terminal 62 is synchronized with the clock signal CLK in the $S_1$ stage and then it is output to the $S_2$ stage. Thereafter, the data is successively converted into parallel data by the 1:m DEMUX blocks. Finally, the parallel data are output from the output terminals of the final output stage, i.e., the $S_n$ stage, as parallel data outputs.

FIG. 15 is a block diagram for explaining the operating principle of the prior art demultiplexer. In the figure, the same reference numerals as those shown in FIG. 20 designate the same or corresponding parts. The demultiplexer 400 includes 1:2 DEMUX blocks 11, 12, and 13 corresponding to the 1:m DEMUX blocks 13a, ½ frequency dividers 15 and 15b corresponding to the frequency dividers 15a, and a D flip-flop 14. Reference character $SIG_1$ denotes serial data.

Although the demultiplexer 400 is a 1:4 demultiplexer converting serial data into four bit parallel data, the operating principle is identical even when the bit number of the output parallel data is changed.

FIG. 16 is a block diagram illustrating a circuit structure of the 1:2 DEMUX blocks 11 to 13 shown in FIG. 15. In FIG. 16, the same reference numerals as those shown in FIG. 13 designate the same or corresponding parts. The 1:2 DEMUX block comprises a D flip-flop 7 to which serial data is input and a D flip-flop 8 with a phase shifter that delays the phase of the serial data by ½ period of the clock with respect to the D flip-flop 7. The period of the clock CLK that is input to the 1:2 DEMUX block is twice as long as the period of the serial data. Although the serial data is input to the D flip-flops 7 and 8, since the D flip-flop 8 has the phase shifter, the serial data input to the D flip-flop 8 is delayed by one period of the data from the data input to the D flip-flop 7. Since the data output from the D flip-flops 7 and 8 are synchronized alternately, the input serial data are alternately output from the D flip-flop 7 and the D flip-flop 8. In this way, the 1:2 DEMUX block converts the serial data into two bit parallel data.

The operation of the 1:m DEMUX block 13a shown in FIG. 20 is fundamentally identical to the above-described operation although the number of the D flip-flops and the operating timing are changed. More specifically, in the 1:m DEMUX block, the number of the D flip-flops is m, and one of the m D flip-flops has no phase shifter. That is, the (m-1) D flip-flops delay the phases of the input clocks by 1/m period, 2/m period, . . . , (m-1)/m period, respectively.

A description is given of the prior art demultiplexer 400 shown in FIG. 15. The demultiplexer 400 comprises the D flip-flop 14, the 1:2 DEMUX blocks 11 to 13, and the frequency dividers 15 and 15b for dividing the frequency of an input clock to by two. The frequency dividers 15 and 15b produce a clock ½ CLK having a frequency equivalent to ½ of the frequency of the high-speed clock CLK and a clock ¼ CLK having a frequency equivalent to ¼ of the frequency of the high-speed clock CLK, respectively. The D flip-flop 14 synchronizes the serial data input to the demultiplexer 400 with the high-speed clock CLK and outputs serial data $SIG_1$. The serial data $SIG_1$ is converted into two bit parallel data ODD and EVEN by the 1:2 DEMUX block 13 in the next stage. Finally, the two bit parallel data ODD and EVEN are converted into four bit parallel data 3, 2, 1, and 0 by the 1:2 DEMUX blocks 11 and 12 in the final output stage, and these parallel data are output from the demultiplexer 400.

FIGS. 17(a)–17(k) show a timing chart of the prior art demultiplexer 400. More specifically, FIGS. 17(h)–17(k) show the timings of the parallel data 3, 2, 1, and 0 output from the demultiplexer, respectively. FIGS. 17(b), 17(d), and 17(g) show the timings of the clocks CLK, ½ CLK, and ¼ CLK, respectively. FIGS. 17(e) and 17(f) show the timings of the parallel data ODD and EVEN, respectively.

FIG. 17(c) shows the timing of the serial data $SIG_1$, and FIG. 17(a) shows the timing of the serial data input to the demultiplexer. In the figures, ΔTa is a delay time in the frequency divider 15, ΔTb is a delay time in the frequency divider 15b, ΔTc is a delay time in the first stage D flip-flop 14, ΔTd is a delay time in the second stage 1:2 DEMUX block 13, and ΔTe is a delay time in the 1:2 DEMUX blocks 11 and 12 at the final output stage.

Now, a description is given of the timing of the 1:2 DEMUX block 13. Assuming that the setup time and the hold time of the D flip-flops 7 and 8 in the 1:2 DEMUX block 13 are $T_{su}$ and $T_h$, respectively, in order to operate the 1:2 DEMUX block 13 normally, the data $SIG_1$ must not be changed, i.e., it must be stable, between the setup time $T_{su}$ and the hold time $T_h$ when the clock ½ CLK rises. If the data $SIG_1$ changes between the setup time $T_{su}$ and the hold time $T_h$, the data selected by the D flip-flops 7 and 8 becomes unstable between the data before the data changing point 19 and the data after that point, whereby the operation becomes unstable. As a result, the timing of the data output from the D flip-flops 7 and 8 varies. The timing of the clock ½ CLK and the data $SIG_1$ to be input to the 1:2 DEMUX block 13 is determined by a difference between the delay time ΔTa and the delay time ΔTc. However, the delay times ΔTa and ΔTc are not always as designed and are significantly vary due to variations in process parameters and the temperature of the constituents of the demultiplexer circuit, whereby the timing of the clock ½ CLK sometimes deviates from the timing of the data $SIG_1$ that is synchronized with the clock CLK. Especially when the operating speed is increased, the time interval where the data $SIG_1$ is not changed is shortened, and the timing margin for the setup time $T_{su}$ and the hold time $T_h$ of the D flip-flops 7 and 8 is reduced, resulting in difficulty in operating the 1:2 DEMUX block 13 normally.

SUMMARY OF THE INVENTION

It is an object of the present invention to provide a multiplexer that operates normally even when the delay times of the constituents of the multiplexer vary due to variations in process parameters and temperature.

It is another object of the present invention to provide a demultiplexer that operates normally even when the delay times of the constituents of the multiplexer vary due to variations in process parameters and temperature.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a multiplexer comprises a plurality of stages including an n-th stage as a final output stage (n=integer, 2≤n) and a j-th stage (j=integer, 1≤j≤n−1), wherein the n-th stage includes a D flip-flop having a clock input terminal for receiving a first clock signal, a data input terminal for receiving serial data, and a data output terminal, the D flip-flop synchronizing the clock signal with the serial data; and the j-th stage includes $m^{n-j-1}$ (m=integer, 2≤m) multiplexer blocks, each multiplexer block comprising a plurality of D flip-flops and having data input terminals for receiving m parallel data and a clock input terminal for receiving a second clock signal that is produced by frequency division of the first clock signal, the multiplexer block converting the parallel data into serial data in response to the second clock signal, and the multiplexer block being connected to a multiplexer block in the next stage so that the serial data output from the multiplexer block in the j-th stage is applied as one of parallel data that is input to the multiplexer block in the next stage. The multiplexer further includes a variable delay circuit connected to the data input terminal of each multiplexer block in any of the second to the n-th stages, and the variable delay circuit delays the data input by a variable delay time. Therefore, even when the delay times of the constituents of the circuit are varied due to variations in the device parameters or the temperature and the timing of the data input is deviated, the timing of the data input is adjusted by the variable delay circuit, whereby the D flip-flop in the stage having the variable delay circuit is normally operated.

According to a second aspect of the present invention, a multiplexer comprises a plurality of stages including an n-th stage as a final output stage (n=integer, 2≤n) and a j-th stage (j=integer, 1≤j≤n−1), wherein the n-th stage includes a D flip-flop having a clock input terminal for receiving a first clock signal, a data input terminal for receiving serial data, and a data output terminal, the D flip-flop synchronizing the clock signal with the serial data; and the j-th stage includes $m^{n-j-1}$ (m=integer, 2≤m) multiplexer blocks, each multiplexer block comprising a plurality of D flip-flops and having data input terminals for receiving m parallel data and a clock input terminal for receiving a second clock signal that is produced by frequency division of the first clock signal, the multiplexer block converting the parallel data into serial data in response to the second clock signal, and the multiplexer block being connected to a multiplexer block in the next stage so that the serial data output from the multiplexer block in the j-th stage is applied as one of parallel data that is input to the multiplexer block in the next stage. The multiplexer further includes a variable delay circuit connected to the clock input terminal of each multiplexer block in any of the first to the (n−1)th stages or to the clock input terminal of the D flip-flop in the n-th stage, and the variable delay circuit delays the clock input by a variable delay time. Therefore, even when the delay times of the constituents of the circuit are varied due to variations in the device parameters or the temperature and the timing of the clock input is deviated, the timing of the clock input is adjusted by the variable delay circuit, whereby the D flip-flop in the stage having the variable delay circuit is normally operated.

According to a third aspect of the present invention, a multiplexer comprises a plurality of stages including an n-th stage as a final stage (n=integer, 2≤n) and an h-th stage (h=integer, 1≤h≤n−1), wherein the n-th stage includes a multiplexer block comprising a plurality of D flip-flops and having a clock input terminal for receiving a first clock signal, a data input terminal for receiving m (m=integer, 2≤m) parallel data, and a data output terminal, the multiplexer block converting the parallel data into serial data in response to the first clock signal; and the h-th stage includes $m^{n-h}$ multiplexer blocks, each multiplexer block comprising a plurality of D flip-flops and having data input terminals for receiving m parallel data and a clock input terminal for receiving a second clock signal that is produced by frequency division of the first clock signal, the multiplexer block converting the parallel data into serial data in response to the second clock signal, and the multiplexer block being connected to a multiplexer block in the next stage so that the serial data output from the multiplexer block in the h-th stage is applied as one of parallel data that is input to the multiplexer block in the next stage. The multiplexer further includes a variable delay circuit connected to the data input terminal of each multiplexer block in any of the second to the n-th stages, and the variable delay circuit delays the data input by a variable delay time. Therefore, even when the delay times of the constituents of the circuit are varied due to variations in the device parameters or the temperature and the timing of the data input is deviated, the timing of the data input is adjusted by the variable delay circuit, whereby the D flip-flop in the stage having the variable delay circuit is normally operated.

According to a fourth aspect of the present invention, a multiplexer comprises a plurality of stages including an n-th stage as a final stage (n=integer, $2 \leq n$) and an h-th stage (h=integer, $1 \leq h \leq n-1$), wherein the n-th stage includes a multiplexer block comprising a plurality of D flip-flops and having a clock input terminal for receiving a first clock signal, a data input terminal for receiving m (m=integer, $2 \leq m$) parallel data, and a data output terminal, the multiplexer block converting the parallel data into serial data in response to the first clock signal; and the h-th stage includes $m^{n-h}$ multiplexer blocks, each multiplexer block comprising a plurality of D flip-flops and having data input terminals for receiving m parallel data and a clock input terminal for receiving a second clock signal that is produced by frequency division of the first clock signal, the multiplexer block converting the parallel data into serial data in response to the second clock signal, and the multiplexer block being connected to a multiplexer block in the next stage so that the serial data output from the multiplexer block in the h-th stage is applied as one of parallel data that is input to the multiplexer block in the next stage. The multiplexer further includes a variable delay circuit connected to the clock input terminal of each multiplexer block in any of the first to the (n−1)th stages or to the clock input terminal of the multiplexer block in the n-th stage, and the variable delay circuit delays the clock input by a variable delay time. Therefore, even when the delay times of the constituents of the circuit are varied due to variations in the device parameters or the temperature and the timing of the clock input is deviated, the timing of the clock input is adjusted by the variable delay circuit, whereby the D flip-flop in the stage having the variable delay circuit is normally operated.

According to a fifth aspect of the present invention, the above-described multiplexers further include means for monitoring data output from the data output terminal of the D flip-flop or the multiplexer block in the final n-th stage; and means for controlling the delay time of the variable delay circuit with a control signal according to the result of the monitoring. Therefore, even when the delay times of the constituents of the circuit are varied due to variations in the device parameters or the temperature and the timing of the data input or the clock input is deviated, the deviation of the timing is monitored and the delay time of the variable delay circuit is controlled according to the result of the monitoring so that the deviation of the timing is prevented, thereby providing a normally operating multiplexer.

According to a sixth aspect of the present invention, in the above-described multiplexers, the variable delay circuit comprises a plurality of lines comprising buffers in different numbers and providing different delay times, the lines being arranged in parallel with each other; and a selector for selecting one of the lines in response to the control signal supplied from the delay time controlling means, the selector being connected to the lines and the delay time controlling means. Therefore, the delay time of the variable delay circuit is easily controlled by switching the lines using the selector, thereby providing a multiplexer that is easily adjusted to the normal operating state even when the delay times of the constituents of the circuit are varied.

According to a seventh aspect of the present invention, in the above-described multiplexers, the variable delay circuit comprises at least a variable delay buffer that is connected to the delay time controlling means and varies the delay time in response to the control signal supplied from the delay time controlling means. Therefore, the delay time of the variable delay circuit is easily controlled by varying the delay time of the variable delay buffer with the control signal, thereby providing a multiplexer that is easily adjusted to the normal operating state even when the delay times of the constituents of the circuit are varied.

According to an eighth aspect of the present invention, in the above-described multiplexers, the variable delay buffer comprises a source follower buffer including a current supply transistor, and the delay time is controlled by controlling a gate voltage of the current supply transistor with the control signal supplied from the delay time controlling means.

According to a ninth aspect of the present invention, a demultiplexer comprises a plurality of stages including a first stage and an i-th stage (i=integer, $2 \leq i \leq n$ (n=integer, $2 \leq n$)), wherein the first stage includes a D flip-flop having a clock input terminal for receiving a first clock signal, a data input terminal for receiving serial data, and a data output terminal, the D flip-flop synchronizing the clock signal with the serial data; and the i-th stage including $m^{i-2}$ (m=integer, $2 \leq m$) demultiplexer blocks, each demultiplexer block comprising a plurality of D flip-flops and having a data input terminal for receiving serial data and a clock input terminal for receiving a second clock signal that is produced by frequency division of the first clock signal, the demultiplexer block converting the serial data into m parallel data in response to the second clock signal, and the demultiplexer block being connected to a demultiplexer block in the prior stage so that one of parallel data output from the demultiplexer block in the prior stage is input to each demultiplexer block in the i-th stage as the serial data input. The demultiplexer further includes a variable delay circuit connected to the data input terminal of each demultiplexer block in any of the second to the n-th stages, and the variable delay circuit delays the data input by a variable delay time. Therefore, even when the delay times of the constituents of the circuit are varied due to variations in the device parameters or the temperature and the timing of the data input is deviated, the timing of the data input is adjusted by the variable delay circuit, whereby the D flip-flop in the stage having the variable delay circuit is normally operated.

According to a tenth aspect of the present invention, a demultiplexer comprises a plurality of stages including a first stage and an i-th stage (i=integer, $2 \leq i \leq n$ (n=integer, $2 \leq n$)), wherein the first stage includes a D flip-flop having a clock input terminal for receiving a first clock signal, a data input terminal for receiving serial data, and a data output terminal, the D flip-flop synchronizing the clock signal with the serial data; and the i-th stage includes $m^{i-2}$ (m=integer, $2 \leq m$) demultiplexer blocks, each demultiplexer block comprising a plurality of D flip-flops and having a data input terminal for receiving serial data and a clock input terminal for receiving a second clock signal that is produced by frequency division of the first clock signal, the demultiplexer block converting the serial data into m parallel data in response to the second clock signal, and the demultiplexer block being connected to a demultiplexer block in the prior stage so that one of parallel data output from the demultiplexer block in the prior stage is input to each demultiplexer block in the i-th stage as the serial data input. The demultiplexer further includes a variable delay circuit connected to the clock input terminal of each demultiplexer block in any of the second to the n-th stages or to the clock input terminal of the D flip-flop in the first stage, and the variable delay circuit delays the clock input by a variable delay time. Therefore, even when the delay times of the constituents of the circuit are varied due to variations in the device parameters or the temperature and the timing of the clock input is deviated, the timing of the clock input is adjusted by the variable delay circuit, whereby the D flip-flop in the stage having the variable delay circuit is normally operated.

According to an eleventh aspect of the present invention, a demultiplexer comprises a plurality of stages including a first stage and a k-th stage (k=integer, $2 \leq k \leq n$ (n=integer, $2 \leq n$)), wherein the first stage includes a demultiplexer block comprising a plurality of D flip-flops and having a clock input terminal for receiving a first clock signal, a data input terminal for receiving serial data, and a data output terminal, the demultiplexer block converting the serial data into m (m=integer, $2 \leq m$) parallel data in response to the first clock signal; and the k-th stage includes $m^{k-1}$ demultiplexer blocks, each demultiplexer block comprising a plurality of D flip-flops and having a data input terminal for receiving serial data and a clock input terminal for receiving a second clock signal that is produced by frequency division of the first clock signal, the demultiplexer block converting the serial data into m parallel data in response to the second clock signal, and the demultiplexer block being connected to a demultiplexer block in the prior stage so that one of parallel data output from the demultiplexer block in the prior stage is input to each demultiplexer block in the k-th stage as the serial data input. The demultiplexer further includes a variable delay circuit connected to the data input terminal of each demultiplexer block in any of the second to the n-th stages, and the variable delay circuit delays the data input by a variable delay time. Therefore, even when the delay times of the constituents of the circuit are varied due to variations in the device parameters or the temperature and the timing of the data input is deviated, the timing of the data input is adjusted by the variable delay circuit, whereby the D flip-flop in the stage having the variable delay circuit is normally operated.

According to a twelfth aspect of the present invention, a demultiplexer comprises a plurality of stages including a first stage and a k-th stage (k=integer, $2 \leq k \leq n$ (n=integer, $2 \leq n$)), wherein the first stage includes a demultiplexer block comprising a plurality of D flip-flops and having a clock input terminal for receiving a first clock signal, a data input terminal for receiving serial data, and a data output terminal, the demultiplexer block converting the serial data into m (m=integer, $2 \leq m$) parallel data in response to the first clock signal; and the k-th stage includes $m^{k-1}$ demultiplexer blocks, each demultiplexer block comprising a plurality of D flip-flops and having a data input terminal for receiving serial data and a clock input terminal for receiving a second clock signal that is produced by frequency division of the first clock signal, the demultiplexer block converting the serial data into m parallel data in response to the second clock signal, and the demultiplexer block being connected to a demultiplexer block in the prior stage so that one of parallel data output from the demultiplexer block in the prior stage is input to each demultiplexer block in the k-th stage as the serial data input. The demultiplexer further includes a variable delay circuit connected to the clock input terminal of each demultiplexer block in any of the second to the n-th stages or to the clock input terminal of the D flip-flop in the first stage, and the variable delay circuit delays the clock input by a variable delay time. Therefore, even when the delay times of the constituents of the circuit are varied due to variations in the device parameters or the temperature and the timing of the clock input is deviated, the timing of the clock input is adjusted by the variable delay circuit, whereby the D flip-flop in the stage having the variable delay circuit is normally operated.

According to a thirteenth aspect of the present invention, the above-described demultiplexers further include means for monitoring data output from the data output terminals of the demultiplexer blocks in the final n-th stage; and means for controlling the delay time of the variable delay circuit with a control signal according to the result of the monitoring. Therefore, even when the delay times of the constituents of the circuit are varied due to variations in the device parameters or the temperature and the timing of the data input or the clock input is deviated, the deviation of the timing is monitored and the delay time of the variable delay circuit is controlled according to the result of the monitoring so that the deviation of the timing is prevented, thereby providing a normally operating demultiplexer.

According to a fourteenth aspect of the present invention, in the above-described demultiplexers, the variable delay circuit comprises a plurality of lines comprising buffers in different numbers and providing different delay times, the lines being arranged in parallel with each other; and a selector for selecting one of the lines in response to the control signal supplied from the delay time controlling means, the selector being connected to the lines and the delay time controlling means. Therefore, the delay time of the variable delay circuit is easily controlled by switching the lines using the selector, thereby providing a demultiplexer that is easily adjusted to the normal operating state even when the delay times of the constituents of the circuit are varied.

According to a fifteenth aspect of the present invention, in the above-described demultiplexers, the variable delay circuit comprises at least a variable delay buffer that is connected to the delay time controlling means and varies the delay time in response to the control signal supplied from the delay time controlling means. Therefore, the delay time of the variable delay circuit is easily controlled by varying the delay time of the variable delay buffer with the control signal, thereby providing a demultiplexer that is easily adjusted to the normal operating state even when the delay times of the constituents of the circuit are varied.

According to a sixteenth aspect of the present invention, in the above-described demultiplexers, the variable delay buffer comprises a source follower buffer including a current supply transistor, and the delay time is controlled by controlling a gate voltage of the current supply transistor with the control signal supplied from the delay time controlling means.

DETAILED DESCRIPTION OF THE PREFERRED EMBODIMENTS

[Embodiment 1]

Figure 1:
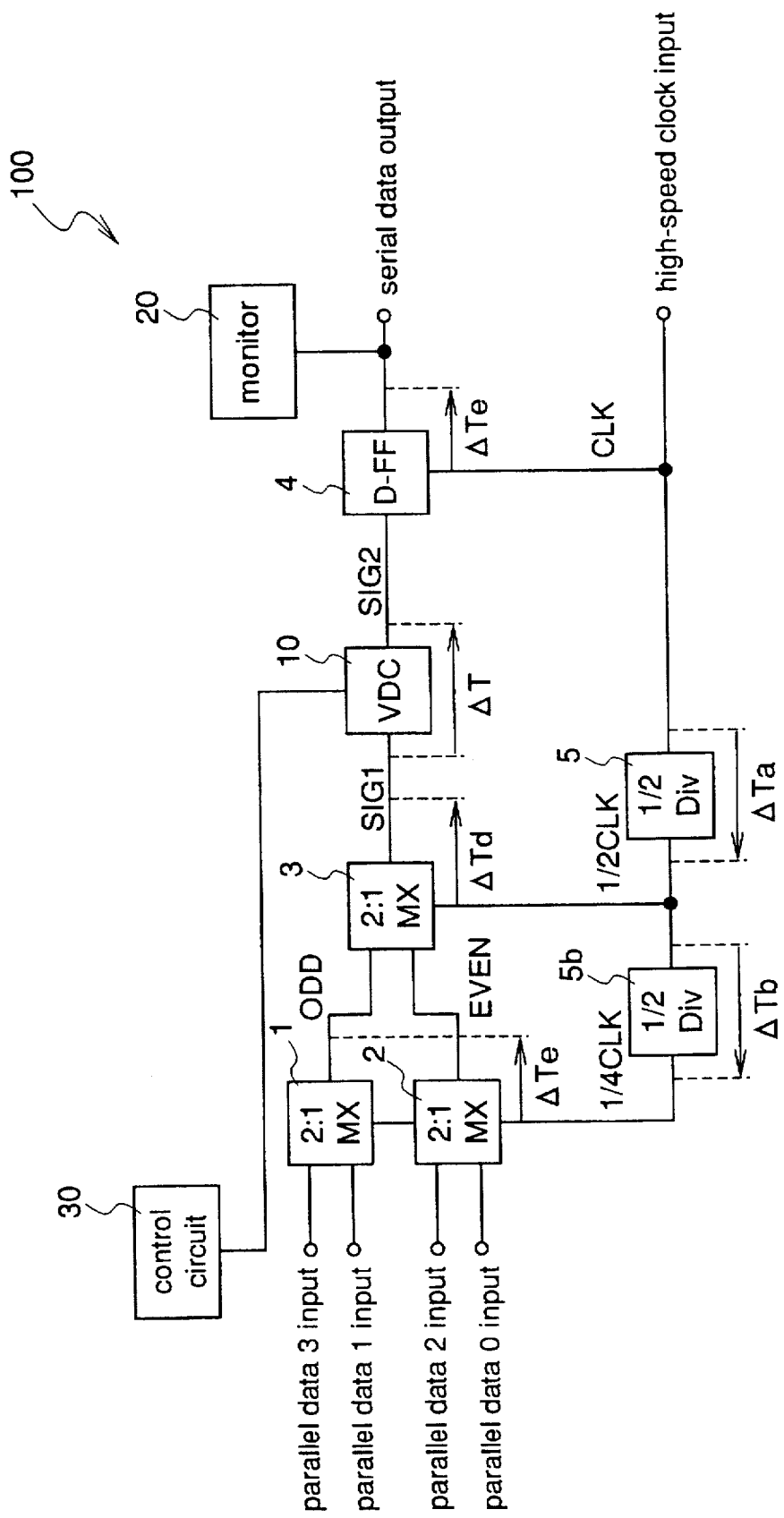
FIG. 1 is a block diagram illustrating a circuit structure of a multiplexer in accordance with a first embodiment of the present invention.
Figure 12:
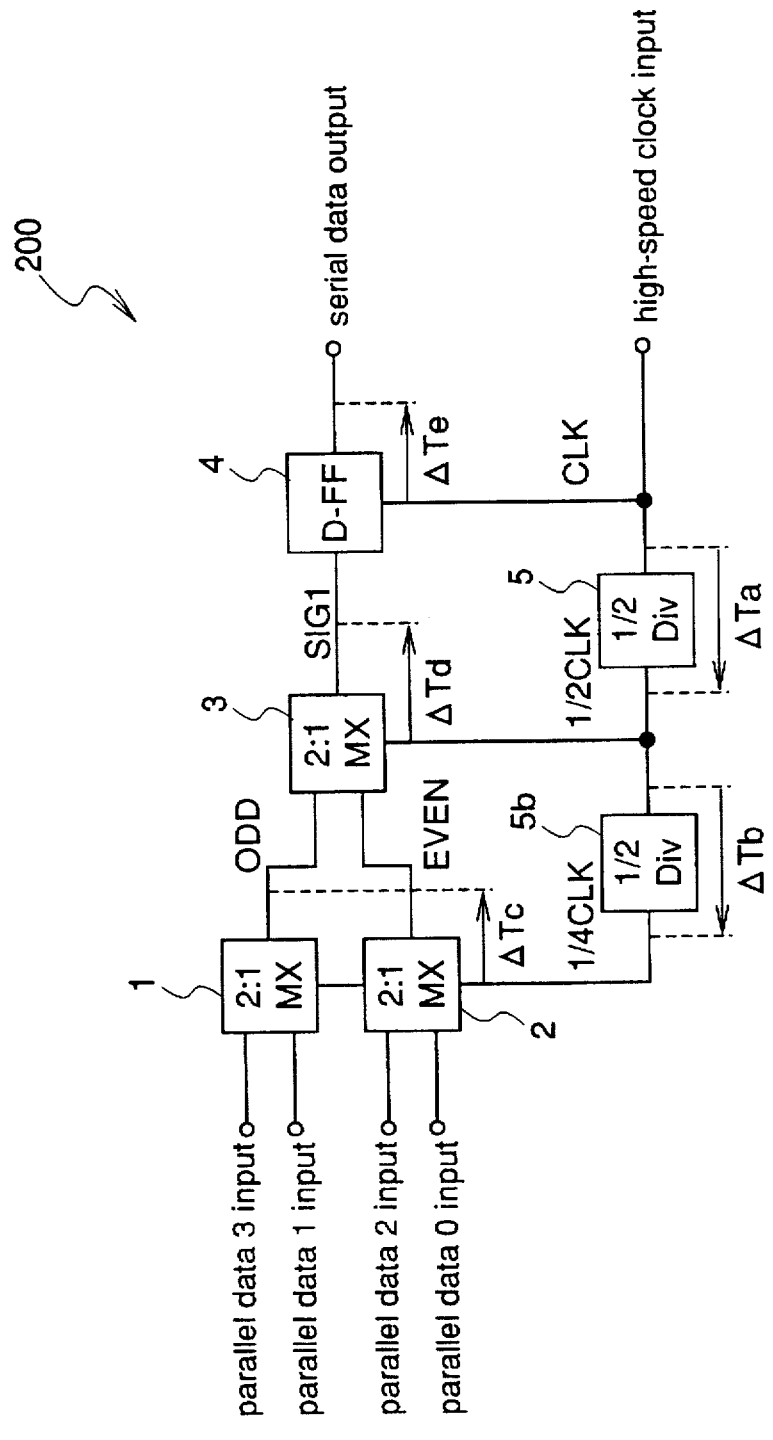
FIG. 12 is a block diagram illustrating a circuit structure of a 4:1 multiplexer according to the prior art.
Figure 13:
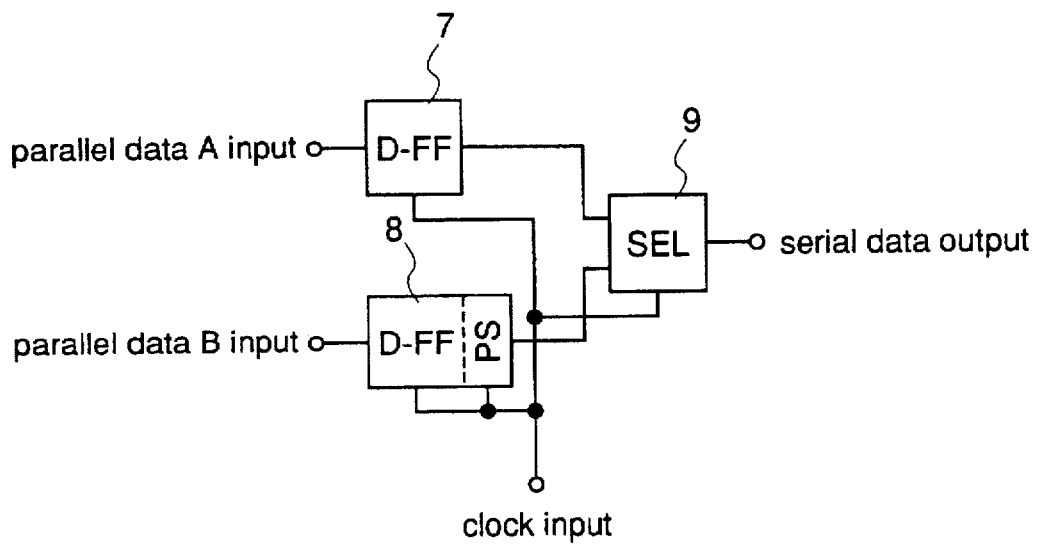
FIG. 13 is a block diagram illustrating a circuit structure of a 2:1 multiplexer block included in the prior art multiplexer.
Figure 14:
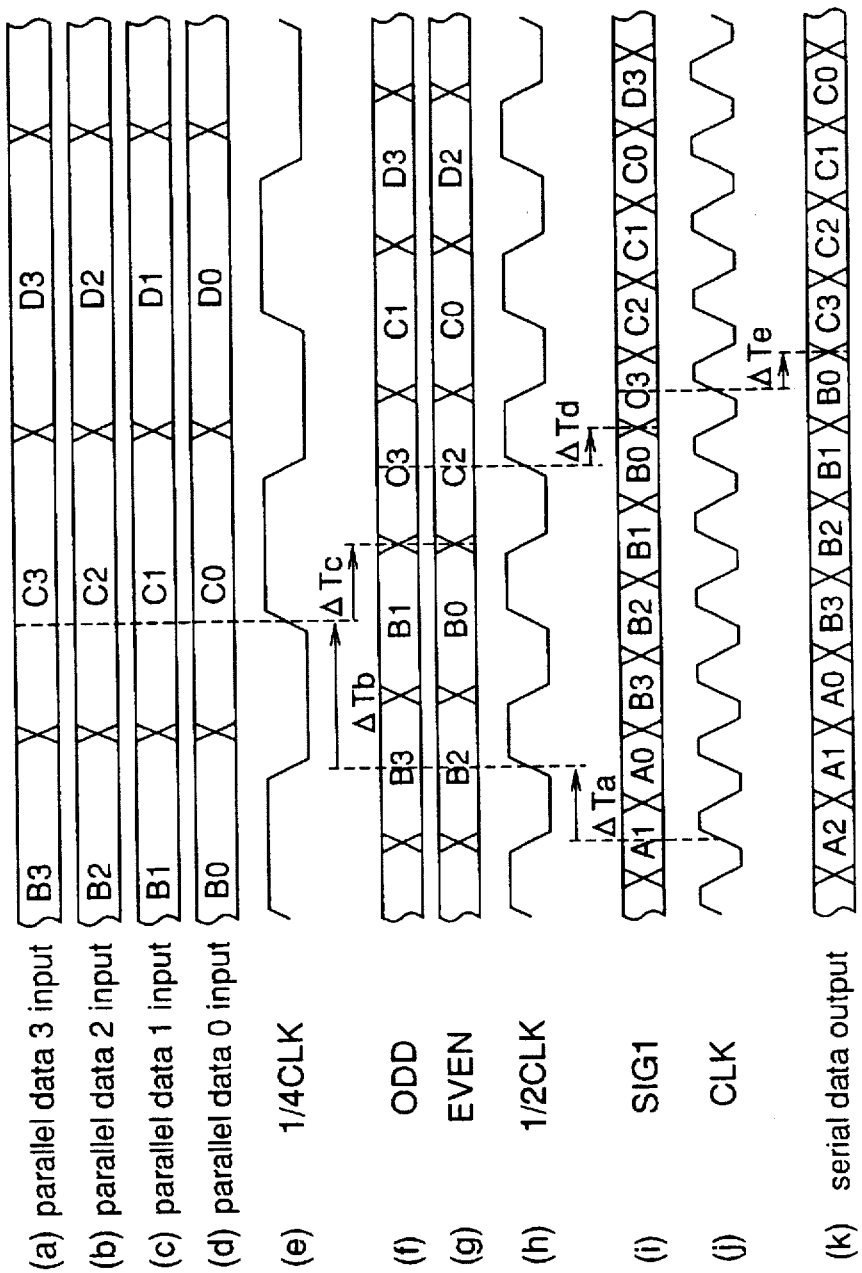
FIGS. 14(a)–14(k) are diagrams illustrating a timing chart of the prior art multiplexer.

FIG. 1 is a block diagram illustrating a circuit structure of a multiplexer in accordance with a first embodiment of the present invention. In the figure, the same reference numerals as those in FIG. 12 designate the same or corresponding parts. Reference numeral 100 designates a multiplexer according to this first embodiment of the invention. The multiplexer 100 comprises 2:1 MUX blocks 1, 2, and 3, a variable delay circuit 10, a D flip-flop 4, ½ frequency dividers 5 and 5b, a monitor 20, and a control circuit 30. More specifically, the 2:1 MUX block 1 receives parallel data 3 and 1 and outputs parallel data ODD. The 2:1 MUX block 2 receives parallel data 2 and 0 and outputs parallel data EVEN. The 2:1 MUX block 3 receives the parallel data ODD and EVEN output from the 2:1 MUX blocks 1 and 2, respectively, and outputs serial data $SIG_1$. The variable delay circuit 10 receives the serial data $SIG_1$ output from the 2:1 MUX block 3, delays the serial data $SIG_1$ by a variable delay time, and outputs serial data $SIG_2$.

Further, the control circuit 30 is connected to the variable delay circuit 10 and controls the variable delay circuit 10 with a control signal that determines the delay time. The D flip-flop 4 receives the serial data $SIG_2$ output from the variable delay circuit 10. The monitor 20 is connected to an output terminal of the D flip-flop 4. The monitor 20 monitors the serial data output from the D flip-flop 4 and compares the serial data with an expected value that is input to the monitor 20 in advance. For example, a measuring instrument or a combination of a measuring instrument and a computer is employed as the monitor 20. A high-speed clock CLK supplied from outside of the multiplexer is input to the D flip-flop 4 and to the ½ frequency divider 5. The ½ frequency divider 5 divides the frequency of the high-speed clock CLK and produces a clock ½ CLK. The clock ½ CLK is input to the 2:1 MUX block 3 and to the ½ frequency divider 5b. The ½ frequency divider 5b divides the frequency of the clock ½ CLK and produces a clock ¼ CLK. The clock ¼ CLK is input to the 2:1 MUX blocks 1 and 2.

Figure 19:
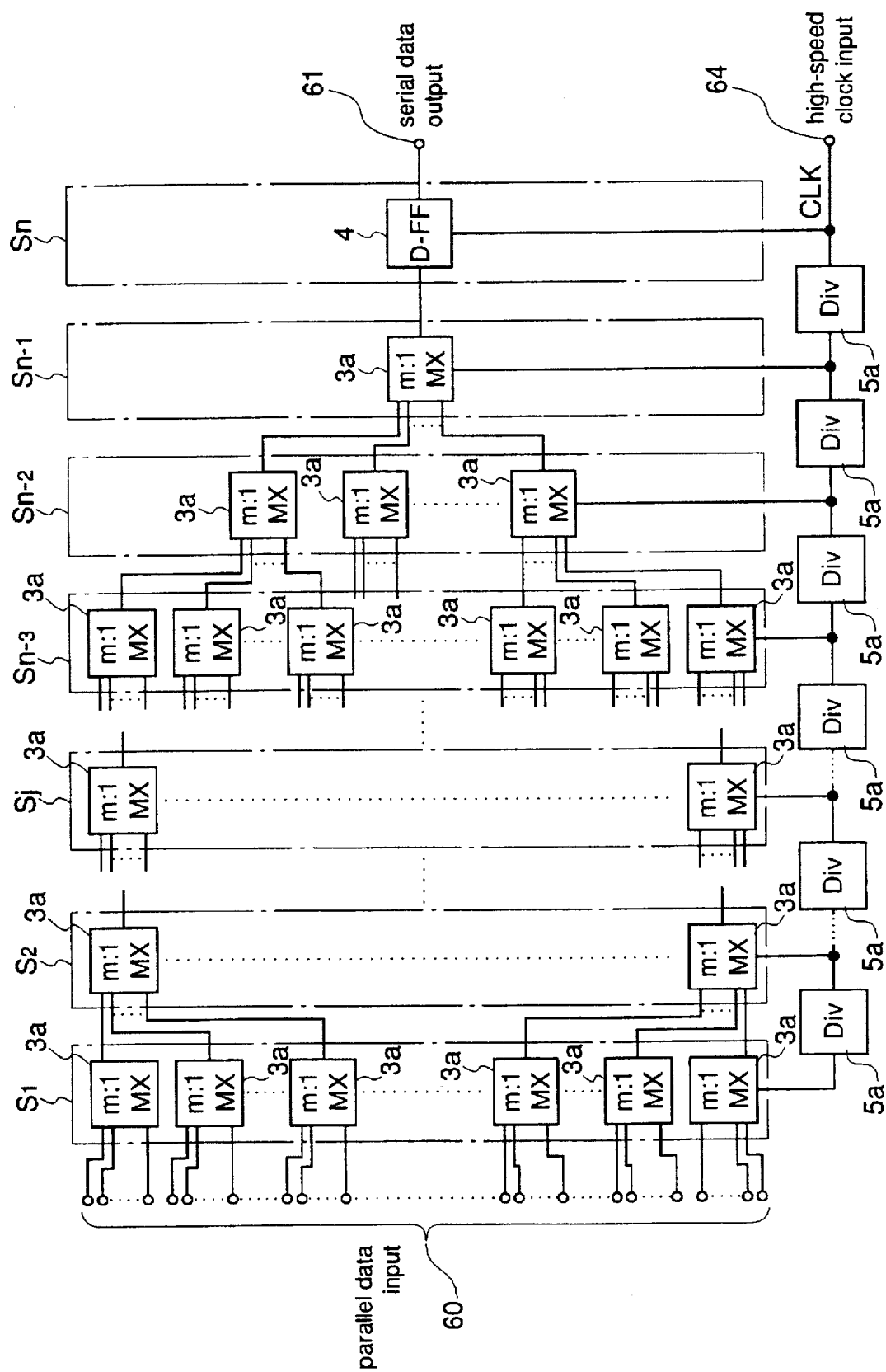
FIG. 19 is a block diagram illustrating a circuit structure of the prior art multiplexer.

The multiplexer according to the first embodiment of the invention is fundamentally identical to the prior art multiplexer shown in FIG. 19 in which the final output stage $S_n$ includes the D flip-flop 4 that synchronizes the clock input CLK with the serial data supplied from the previous stage $S_{n-1}$, and the j-th stage $S_j$ (j=integer, 1≦j≦n−1) includes $m^{n-j-1}$ m:1 MUX blocks 3a for converting the m parallel data into serial data using a clock signal that is obtained by dividing the clock input CLK using the (n−j) frequency dividers 5a. However, the multiplexer according to the first embodiment further includes a monitor for monitoring an output from the D flip-flop 4 in the final output stage, a variable delay circuit connected to the data input terminal of the D flip-flop 4, and a control circuit for controlling the variable delay circuit, whereby the variable delay circuit is controlled by the control circuit according to the result of the monitoring to adjust the variable delay time.

Although the multiplexer 100 according to the first embodiment of the invention is a 4:1 multiplexer, the monitor 20, the variable delay circuit 10, and the control circuit 30 may be applied to a multiplexer including n stages of m:1 MUX blocks as shown in FIG. 19 with the same operating principle and the same effects.

Figure 7:
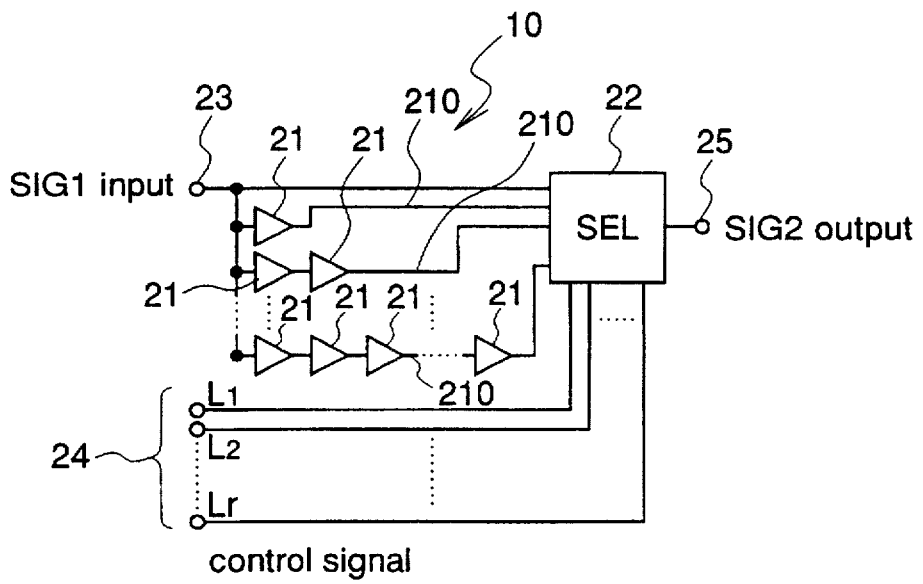
FIG. 7 is a block diagram illustrating a variable delay circuit included in a multiplexer according to the first embodiment of the invention.

FIG. 7 is a block diagram illustrating a structure of the variable delay circuit 10 according to this first embodiment of the invention. In the figure, reference numeral 23 designates an input terminal of the variable delay circuit 10 to which the serial data $SIG_1$ is applied. Reference numeral 22 designates a $2^r$:1 selector that has $2^r$ data input terminals and selects one of $2^r$ data inputs. One of the $2^r$ input terminals of the selector 22 is connected to the input terminal 23 of the variable delay circuit 10. The selector 22 is controlled by control signals $L_1$ to $L_r$ which are input to control signal input terminals 24. The data $SIG_2$ selected in the selector 22 is output from the data output terminal 25. A plurality of lines 210 in which one, two, four, . . . , and $2^{r-1}$ buffers 21 are respectively connected in series (hereinafter referred to as buffer lines) are connected between the input terminal 23 and the ($2^r$−1) input terminals of the selector 22.

In this first embodiment of the invention, in order to vary the delay time of the variable delay circuit 10, the delay times of the respective buffer lines 210 are varied by changing the number of the buffers 21 included in the buffer lines 210. Alternatively, the delay times of the respective buffer lines 210 can be varied by changing the kind, fan-out number, fan-in number, wiring length, or I/O method of the buffers included in the respective buffer lines.

Figure 2:
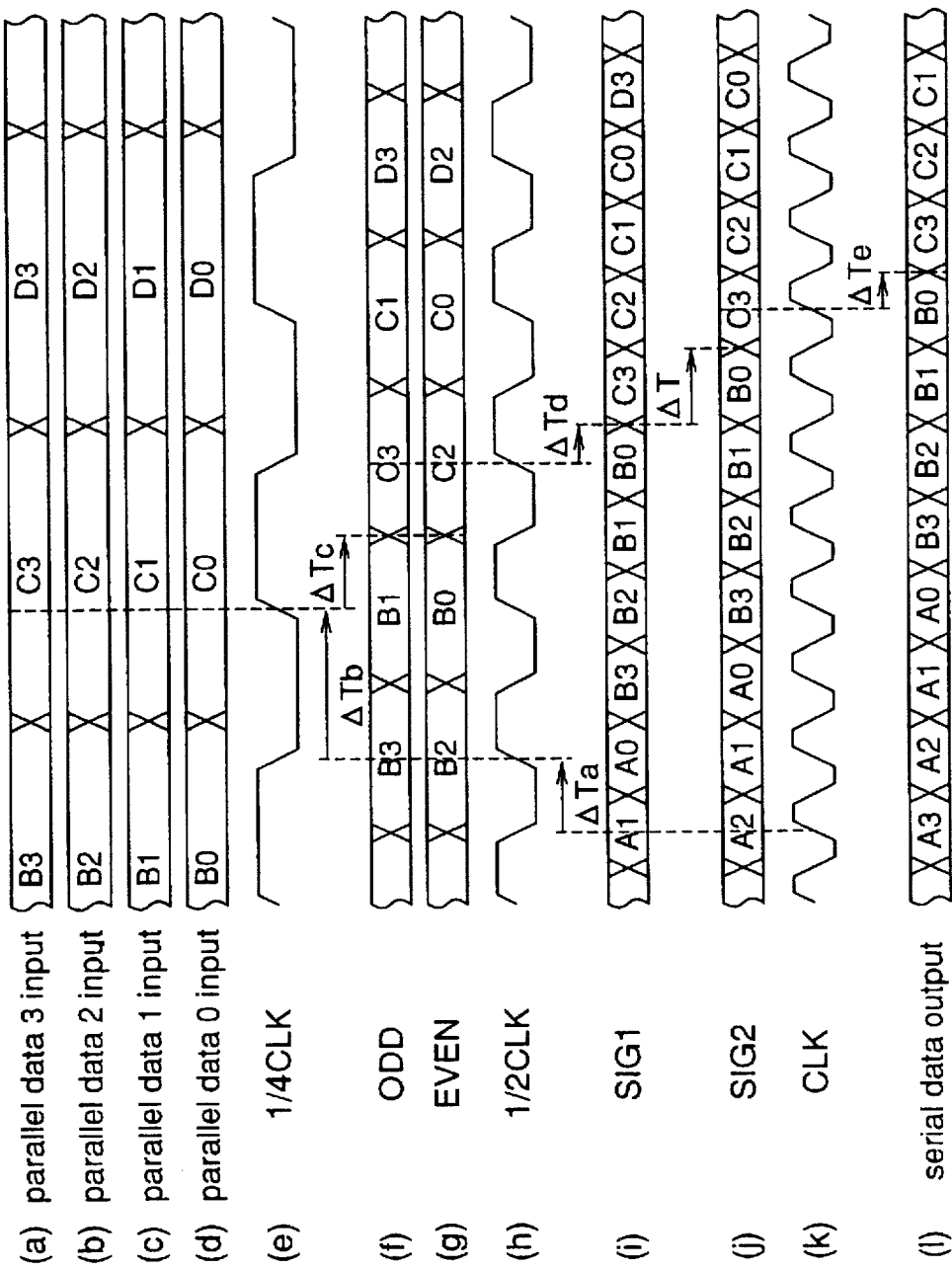
FIGS. 2(a)–2(l) are diagrams illustrating a timing chart of the multiplexer according to the first embodiment of the invention.

FIGS. 2(a)–2(l) are diagrams illustrating a timing chart of the multiplexer 100 according to this first embodiment of the invention. More specifically, FIGS. 2(a)–2(d) show the timings of the parallel data 3, 2, 1, and 0 input to the multiplexer 100, respectively. FIGS. 2(e) and 2(h) show the timings of the clocks ¼ CLK and ½ CLK, respectively. FIGS. 2(f) and 2(g) show the timings of the parallel data ODD and EVEN, respectively. FIG. 2(i) shows the timing of the serial data $SIG_1$. FIG. 2(k) shows the timing of the high-speed clock CLK. FIG. 2(j) shows the timing of the serial data $SIG_2$ output from the variable delay circuit 10, and FIG. 2(l) shows the timing of the serial data output from the D flip-flop 4. In these figures, the same reference characters as those shown in FIGS. 14(a)–14(k) denote the same or corresponding elements. Reference character ΔT denotes a delay time in the variable delay circuit 10.

First of all, the operation of the variable delay circuit 10 shown in FIG. 7 will be described. The input terminal 23 to which the data $SIG_1$ is input is connected to the selector 22 through the buffer lines 210 which are arranged in parallel and include the buffers 21 in different numbers. The selector 22 selects one of the buffer lines 210 in response to a control signal that is supplied from the control circuit 30 through the control signal input terminal 24 to the selector 22. Thereby, the number of the buffers 21 through which the input data $SIG_1$ travels is changed, and a desired delay time is obtained. For example, when the variable delay circuit has r (r=integer) control signal input terminals 24 to which control signals $L_1$ to $L_r$ are applied, one of $2^r$ buffer lines respectively including different numbers of buffers is selected, whereby $2^r$ stages of delay are possible. In this way, a line having an optimum delay time is selected from a plurality of lines with different delay times using control signals $L_1$–$L_r$, whereby the delay time of the data output $SIG_2$ is easily varied.

A description is given of the operation of the multiplexer according to the first embodiment of the invention. initially, a high-speed clock CLK is divided using the frequency dividers 5 and 5b to produce a clock ½ CLK having a frequency equivalent to ½ of the frequency of the high-speed clock CLK and a clock ¼ CLK having a frequency equivalent to ¼ of the frequency of the high-speed clock CLK. In the first stage 2:1 MUX blocks 1 and 2, using the clock ¼ CLK, four bit parallel data 3, 2, 1, and 0 are converted into two bit parallel data ODD and EVEN. In the second stage 2:1 MUX block 3, using the clock ½ CLK, the two bit parallel data ODD and EVEN are converted into serial data $SIG_1$. Then, this serial data $SIG_1$ is delayed by ΔT by the variable delay circuit 10 to produce serial data $SIG_2$. Finally, by the D flip-flop 4 at the final output stage, the serial data $SIG_2$ is synchronized with the high-speed clock CLK that is directly input from the outside of the multiplexer 100, whereby the serial data $SIG_2$ is delayed by ΔTe. The serial data output obtained from the D flip-flop 4 is output from the multiplexer 100.

In the multiplexer 100 according to the first embodiment of the invention, known parallel data 3, 2, 1, 0 for testing are input to a multiplexer identical to the multiplexer 100 and kept at a temperature proximate to an actual operating temperature, and an output from the final output stage is monitored using the monitor 20. The delay time ΔT of the data $SIG_2$ in the variable delay circuit 10 is adjusted in response to a control signal supplied from the control circuit 30 so that the monitored value becomes equivalent to an expected value for the serial data output obtained from the parallel data for test. In the prior art multiplexer 200, the delay times of the constituents of the circuit are unfavorably varied due to variations in the process parameters and the temperature, so that the timing of the high-speed clock CLK and the serial data $SIG_1$ to be input to the D flip-flop 4 vary from the design timing, whereby the D flip-flop 4 is not normally operated.

However, in this first embodiment of the invention, the delay time of the variable delay circuit 10 is adjusted in advance. Therefore, even when the timing of the high-speed clock CLK and the serial data $SIG_1$ varies from the design timing and the data changing point of the serial data $SIG_1$ is placed between the setup time and the hold time of the D flip-flop 4, since the timing of the serial data $SIG_1$ is adjusted in the variable delay circuit 10 and the timing-adjusted serial data $SIG_2$ is input to the D flip-flop 4, the data changing point of the data input $SIG_2$ is prevented from being placed between the setup time and the hold time of the D flip-flop 4, whereby the deviation of the timing in the final output stage, i.e., the D flip-flop 4, is avoided. As a result, the multiplexer 100 is normally operated.

The control of the output signal from the control circuit according to the result of the monitoring may be manually performed. Alternatively, the control of the output signal may be automated with the result of the monitoring in advance.

As described above, in the multiplexer according to the first embodiment of the invention, the variable delay circuit 10 is connected to the data input terminal of the D flip-flop 4 for timing control, and the delay time of the variable delay circuit 10 is controlled by the control circuit in response to the output of the D flip-flop 4 that is monitored by the monitor 20, whereby the timing of the serial data input to the D flip-flop is adjusted. Therefore, even when the delay times of the constituents of the circuit vary due to variations in device parameters and temperature, it is possible to normally operate the D flip-flop 4 using the timing-adjusted serial data, whereby the multiplexer operates normally.

Furthermore, in this first embodiment of the invention, since the variable delay circuit 10 includes the selector 22 that selects one of the buffer lines 210 comprising different numbers of the buffers 21 and having different delay times, the delay time of the variable delay circuit 10 is easily varied by switching the buffer lines 210 of the selector 22, whereby a normally operating multiplexer is provided even when the delay times of the constituents of the circuit are varied.

In this first embodiment of the invention, the variable delay circuit 10 is connected to the data input terminal of the D flip-flop 4 in the final output stage. However, a similar structure in which the variable delay circuit is connected to the data input terminals of the MUX blocks constituting any of the other output stages, except the first output stage, is also within the scope of the invention. In this case, the variable delay circuit must be connected to the data input terminals of all of the D flip-flops constituting the output stage.

[Embodiment 2]

Figure 3:
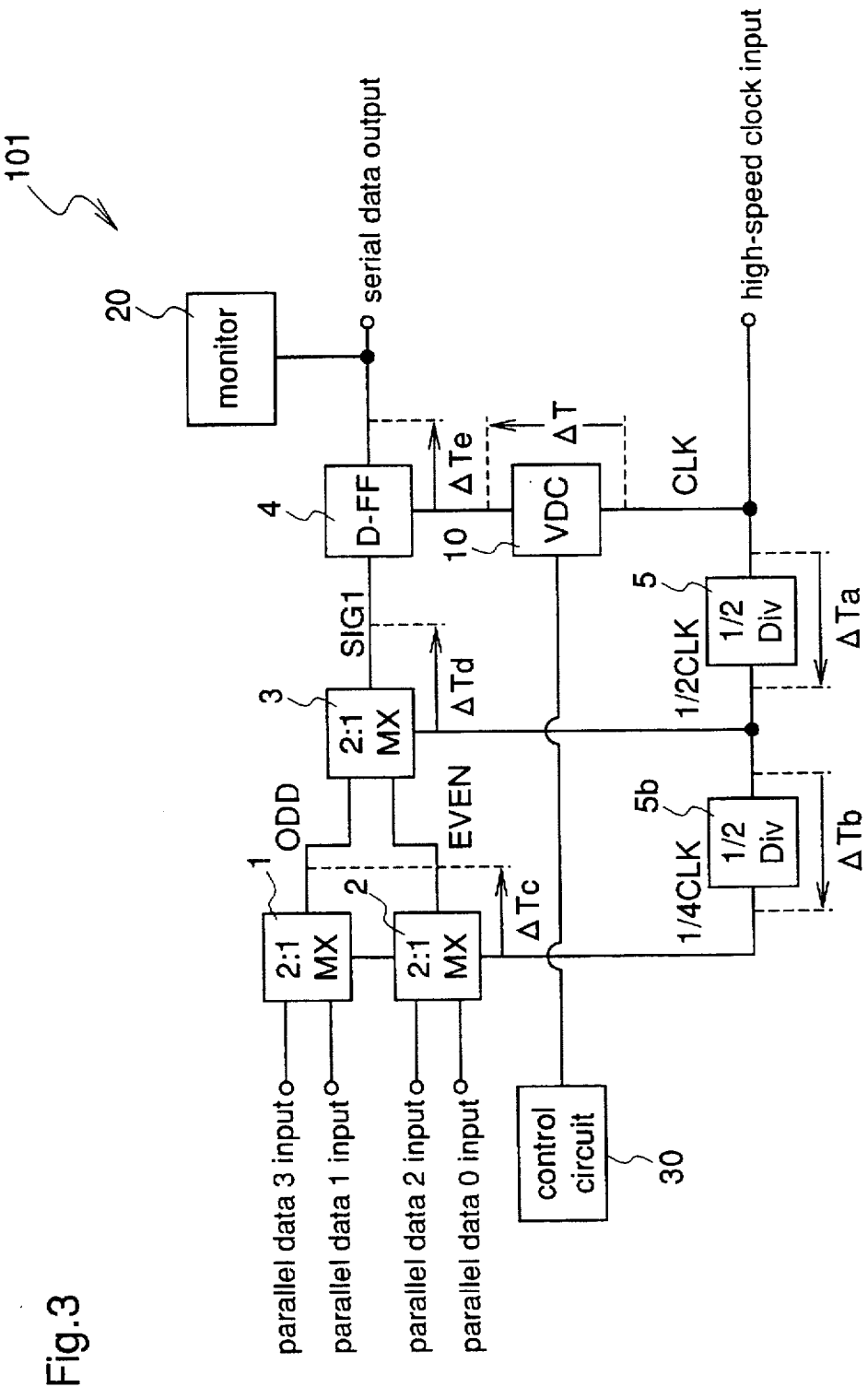
FIG. 3 is a block diagram illustrating a circuit structure of a multiplexer in accordance with a second embodiment of the present invention.

FIG. 3 is a block diagram illustrating a circuit structure of a multiplexer in accordance with a second embodiment of the present invention. In the figure, the same reference numerals as those in FIG. 1 designate the same or corresponding parts. Reference numeral 101 designates a multiplexer according to this second embodiment of the invention. The multiplexer 101 comprises 2:1 MUX blocks 1, 2, and 3, a variable delay circuit 10, a D flip-flop 4, ½ frequency dividers 5 and 5b, a monitor 20, and a control circuit 30. More specifically, the 2:1 MUX block 1 receives parallel data 3 and 1 and outputs parallel data ODD. The 2:1 MUX block 2 receives parallel data 2 and 0 and outputs parallel data EVEN. The 2:1 MUX block 3 receives the parallel data ODD and EVEN output from the 2:1 MUX blocks 1 and 2, respectively, and outputs serial data $SIG_1$. The D flip-flop 4 receives the serial data $SIG_1$ output from the 2:1 MUX block 3. The monitor 20 is connected to an output terminal of the D flip-flop 4. The monitor 20 monitors the serial data output from the D flip-flop 4 and compares the serial data with an expected value that is input to the monitor 20 in advance. For example, a measuring instrument or a combination of a measuring instrument and a computer is employed as the monitor 20. Further, the variable delay circuit 10 receives a high-speed clock CLK supplied from outside of the multiplexer and delays the high-speed clock CLK. The variable delay circuit 10 controls the delay time of the input signal at variable values. The control circuit 30 is connected to the variable delay circuit 10 and controls the variable delay circuit 10 with a control signal that determines the delay time. The ½ frequency divider 5 divides the frequency of the high-speed clock CLK and produces a clock ½ CLK. The clock ½ CLK is input to the 2:1 MUX block 3 and the ½ frequency divider 5b. The ½ frequency divider 5b divides the frequency of the clock ½ CLK and produces a clock ¼ CLK. The clock ¼ CLK is input to the 2:1 MUX blocks 1 and 2.

While in the first embodiment of the invention the variable delay circuit 10 is connected to the data input terminal of the D flip-flop 4 in the final output stage, in this second embodiment it is connected to the clock input terminal of the D flip-flop 4, whereby the clock signal input to the D flip-flop 4 is delayed at variable values.

In this second embodiment of the invention, the variable delay circuit 10 is connected to the clock input terminal of the D flip-flop 4 in the final output stage. However, a similar structure in which the variable delay circuit is connected to the frequency-divided clock input terminals of the MUX blocks constituting any of other output stages is also within the scope of the invention. In this case, the variable delay circuit must be connected to the frequency-divided clock input terminals of all of the D flip-flops constituting the output stage.

The operation of the 4:1 multiplexer according to the second embodiment of the invention will be described.

In the first embodiment of the invention, when the timing of the high-speed clock CLK and the data input $SIG_1$ to be input to the D flip-flop 4 vary from the design timing, a control signal supplied from the control circuit 30 is input to the variable delay circuit 10 to adjust the timing of the data input $SIG_1$ and produce a data input $SIG_2$, and the data input $SIG_2$ is input to the D flip-flop 4, whereby the D flip-flop 4 is normally operated. On the other hand, in this second embodiment, when the timing of the high-speed clock CLK and the data input $SIG_1$ to be input to the D flip-flop 4 vary from the design timing, a clock adjusted by delaying the high-speed clock CLK by the variable delay circuit 10 is input to the D flip-flop 4, whereby the timing of the high-speed clock CLK and the data input $SIG_1$ is made proximate to the design timing.

Initially, the high-speed clock CLK is divided by the frequency dividers 5 and 5b to produce a clock ½ CLK having a frequency equivalent to ½ of the frequency of the high-speed clock CLK and a clock ¼ CLK having a frequency equivalent to ¼ of the frequency of the high-speed clock CLK. In the first stage 2:1 MUX blocks 1 and 2, using the clock ¼ CLK, four bit parallel data 3, 2, 1, and 0 are converted into two bit parallel data ODD and EVEN. In the second stage 2:1 MUX block 3, using the clock ½ CLK, the two bit parallel data ODD and EVEN are converted into serial data $SIG_1$. Then, this serial data $SIG_1$ is input to the D flip-flop 4 in the final output stage. Since a clock signal that is obtained by delaying the high-speed clock CLK by $\Delta T$ by the variable delay circuit 10 is input to the D flip-flop 4, the input serial data $SIG_1$ is synchronized with the delayed high-speed clock and delayed by $\Delta Te$. Finally, thus obtained serial data is output from the multiplexer 101.

In the multiplexer 101 according to the second embodiment of the invention, known parallel data 3, 2, 1, 0 for test are input to a multiplexer identical to the multiplexer 101 according to the second embodiment and kept at a temperature proximate to an actual operating temperature, and an output from the final output stage is monitored using the monitor 20. The delay time $\Delta T$ of the high-speed clock CLK in the variable delay circuit 10 is adjusted in response to a control signal supplied from the control circuit 30 so that the monitored value becomes the same as an expected value for the serial data output obtained from the parallel data for test. In the prior art multiplexer 200, the delay times of the constituents of the circuit are unfavorably varied due to variations in the process parameters and the temperature, so that the timing of the high-speed clock CLK and the data input $SIG_1$ to be input to the D flip-flop 4 varies from the design timing, whereby the D flip-flop 4 is not normally operated.

However, in this second embodiment of the invention, the delay time of the variable delay circuit 10 is adjusted in advance. Therefore, even when the timing of the high-speed clock CLK and the data input $SIG_1$ to be input to the D flip-flop 4 varies from the design timing and the data changing point of the data input $SIG_1$ is located between the setup time and the hold time of the D flip-flop 4, since the deviation of the timing is adjusted by delaying the high-speed clock CLK in the variable delay circuit 10, the changing point of the output from the D flip-flop 4 is prevented from being placed between the setup time and the hold time of the D flip-flop 4. As a result, the deviation of the timing in the final output stage, i.e., the D flip-flop 4, is avoided, whereby the multiplexer 101 is normally operated.

The control of the output signal using the control circuit according to the result of the monitoring may be manually performed. Alternatively, the control of the output signal may be automated with the result of the monitoring in advance.

As described above, in the multiplexer according to the second embodiment of the invention, the variable delay circuit 10 is connected to the clock input terminal of the D flip-flop 4 in the final output stage, and the delay time of the variable delay circuit 10 is controlled to adjust the timing of the clock input to the D flip-flop 4. Therefore, even when the delay times of the constituents of the circuit to vary due to variations in the device parameters and the temperature and the timing of the data input varies from the timing of the clock input or the divided clock input, since the delay time of the variable delay circuit is adjusted by the control circuit according to the result of the monitoring so that the deviation is prevented, the D flip-flop provided with the variable delay circuit is normally operated.

Furthermore, since the variable delay circuit 10 includes the selector 22 that selects one of the buffer lines 210 comprising the buffers 21 and having different delay times, the delay time of the variable delay circuit 10 is easily varied by switching the buffer lines 210 in the selector 22. Therefore, a normally operating multiplexer is realized even when the delay times of the constituents of the circuit are varied.

[Embodiment 3]

Figure 10:
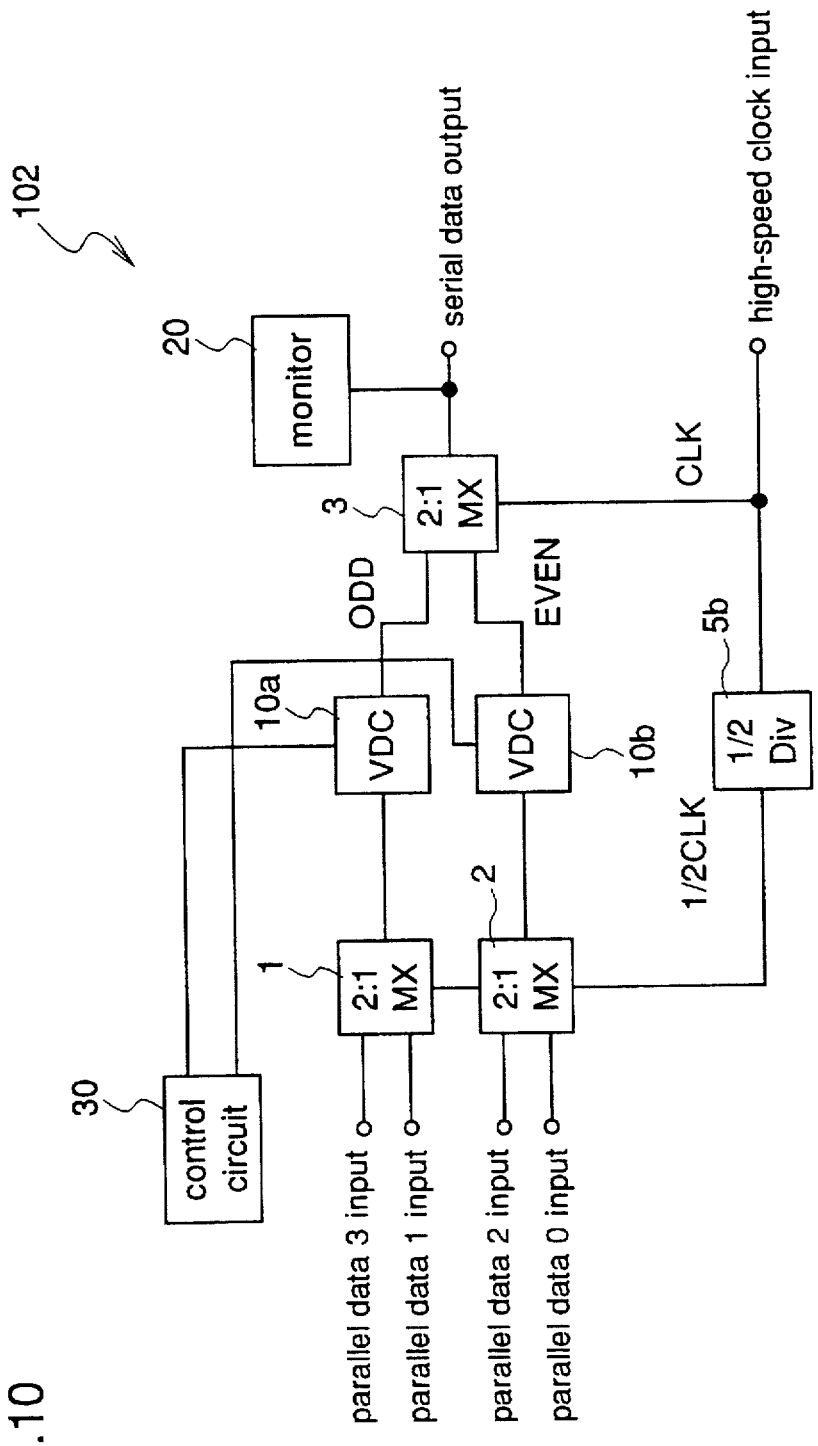
FIG. 10 is a block diagram illustrating a circuit structure of a multiplexer in accordance with a third embodiment of the present invention.

FIG. 10 is a block diagram illustrating a circuit structure of a multiplexer in accordance with a third embodiment of the present invention. In the figure, the same reference numerals as those shown in FIG. 1 designate the same or corresponding parts. Reference numeral 102 designates a multiplexer according to the third embodiment of the invention. The multiplexer 102 comprises 2:1 MUX blocks 1, 2, and 3, variable delay circuits 10a and 10b, a ½ frequency divider 5b, a monitor 20, and a control circuit 30. More specifically, the 2:1 MUX block 1 receives parallel data inputs 3 and 1 and outputs serial data. The 2:1 MUX block 2 receives parallel data inputs 2 and 0 and outputs serial data. The variable delay circuits 10a and 10b receive the serial data output from the 2:1 MUX blocks 1 and 2 and delay the serial data, respectively. These variable delay circuits 10a and 10b are identical to the variable delay circuit 10 according to the first and second embodiments.

Further, the control circuit 30 is connected to the variable delay circuits 10a and 10b and controls the variable delay circuits 10a and 10b with a control signal that determines the delay time. The variable delay circuits 10a and 10b output data ODD and data EVEN, respectively, and these data ODD and EVEN are input to the 2:1 MUX block 3. The monitor 20 is connected to an output terminal of the 2:1 MUX block 3. The monitor 20 monitors the serial data output from the 2:1 MUX block 3 and compares the serial data with an expected value that is input to the monitor 20 in advance. For example, a measuring instrument or a combination of a measuring instrument and a computer is employed as the monitor 20. The ½ frequency divider 5 divides the frequency of the high-speed clock CLK supplied from the outside of multiplexer and produces a clock ½ CLK. The clock ½ CLK is input to the 2:1 MUX blocks 1 and 2.

In the first embodiment of the invention, a variable delay circuit is included in a multiplexer in which serial data is synchronized with a clock input in a D flip-flop at the final output stage. In this third embodiment, however, the final output stage, i.e., the n-th stage (n=integer, 2≦n), includes an m:1 MUX block that converts m (m=integer, 2≦m) parallel data into serial data using a clock signal. The h-th stage (h 32 integer, 1≦h≦n−1) includes $m^{n-h}$ m:1 MUX blocks that convert the m parallel data into serial data using a frequency-divided clock input obtained by frequency division of the clock signal. In this structure, variable delay circuits are connected to the data input terminals of the m:1 MUX block in the final output stage, i.e., the n-th stage.

In this third embodiment, the variable delay circuits 10a and 10b are connected to the data input terminals of the MUX block 3 in the final output stage. However, a similar structure in which the variable delay circuits are connected to the clock input terminals or the frequency-divided clock input terminals of the MUX blocks constituting any output stage is also within the scope of the invention. In this case, the variable delay circuit must be connected to the clock input terminals or the frequency-divided clock input terminals of all of the D flip-flops constituting the output stage. Likewise, a similar structure in which the variable delay circuits are connected to the data input terminals of the MUX blocks constituting any other output stages, except the first output stage, is also within the scope of the invention. In this case, the variable delay circuits must be connected to the data input terminals of all of the D flip-flops constituting the output stage.

A description is given of the operation of the 4:1 multiplexer according to the third embodiment of the invention. While in the first embodiment of the invention the variable delay circuit 10 is included in a multiplexer in which the serial data $SIG_1$ are synchronized with the clock CLK by the D flip-flop 4 in the final output stage, in this third embodiment of the invention the final output stage is constituted by the 2:1 MUX block 3 and the variable delay circuits 10a and 10b are connected to the data input terminals of the 2:1 MUX block 3 in the final output stage.

Initially, the high-speed clock CLK is divided by the frequency divider 5b to produce a clock ½ CLK having a frequency equivalent to ½ of the frequency of the high-speed clock CLK. In the first stage 2:1 MUX blocks 1 and 2, using the clock ½ CLK, four bit parallel data 3, 2, 1, and 0 are converted into two bit parallel data. These two bit parallel data are delayed in the variable delay circuits 10a and 10b, respectively, producing two bit parallel data ODD and EVEN. These parallel data ODD and EVEN are converted into serial data by the 2:1 MUX block 3 and this serial data is output from the multiplexer 102.

In the multiplexer 102 according to the third embodiment of the invention, known parallel data inputs 3, 2, 1, and 0 for test are input to a multiplexer identical to the multiplexer 102 according to the third embodiment and kept at a temperature proximate to an actual operating temperature, and an output from the final output stage is monitored using the monitor 20. The delay times of the output data from the 2:1 MUX blocks 1 and 2 in the variable delay circuits 10a and 10b are controlled in response to a control signal output from the control circuit 30 so that the monitored value becomes equivalent to an expected value for the serial data output obtained from the parallel data for test. In the prior art multiplexer 200, the delay times of the constituents of the circuit are unfavorably varied due to variations in the process parameters and the temperature, so that the timing of the high-speed clock CLK and the parallel data ODD and EVEN to be input to the 2:1 MUX block 3 unfavorably varies from the design timing.

In this third embodiment, however, the delay time of the variable delay circuits 10a and 10b is adjusted in advance. Therefore, even when the timing of the high-speed clock CLK and the parallel data ODD and EVEN to be input to the m:1 MUX block 3 varies from the design timing and the changing point of the parallel data ODD and EVEN is placed in the switching time of the 2:1 MUX block 3, since the deviation of the timing of the parallel data is adjusted by delaying the parallel data in the variable delay circuits 10a and 10b, the changing point of the parallel data ODD and EVEN is prevented from being placed in the switching time of the 2:1 MUX block 3. As a result, the deviation of the timing in the final output stage, i.e., the 2:1 MUX block 3, is avoided, whereby the multiplexer 102 is normally operated.

The control of the output signal from the control circuit according to the result of the monitoring may be manually performed. Alternatively, the control of the output signal may be automated with the result of the monitoring in advance.

As described above, in the multiplexer according to the third embodiment of the invention, the variable delay circuits 10a and 10b are connected to the data input terminals of the 2:1 MUX block 3 in the final output stage, and the delay time is controlled to adjust the timing of the data input to the 2:1 MUX block 3. Therefore, as in the first embodiment of the invention, even when the delay times of the constituents of the circuit are varied due to variations in the device parameters and the temperature and the timing of the data input, clock input, or frequency-divided clock input is deviate, since the delay time of the variable delay circuit is adjusted in advance by the control circuit according to the result of the monitoring so that the deviation is compensated, the 2:1 MUX block provided with the variable delay circuit is normally operated.

Furthermore, in this third embodiment of the invention, since the variable delay circuit 10a (10b) includes the selector 22 that selects one of the buffer lines 210 comprising the buffers 21 and having different delay times, the delay time of the variable delay circuit is easily varied by switching the buffer lines 210 of the selector 22, whereby a normally operating multiplexer is provided even when the delay times of the constituents of the circuit vary.

[Embodiment 4]

Figure 4:
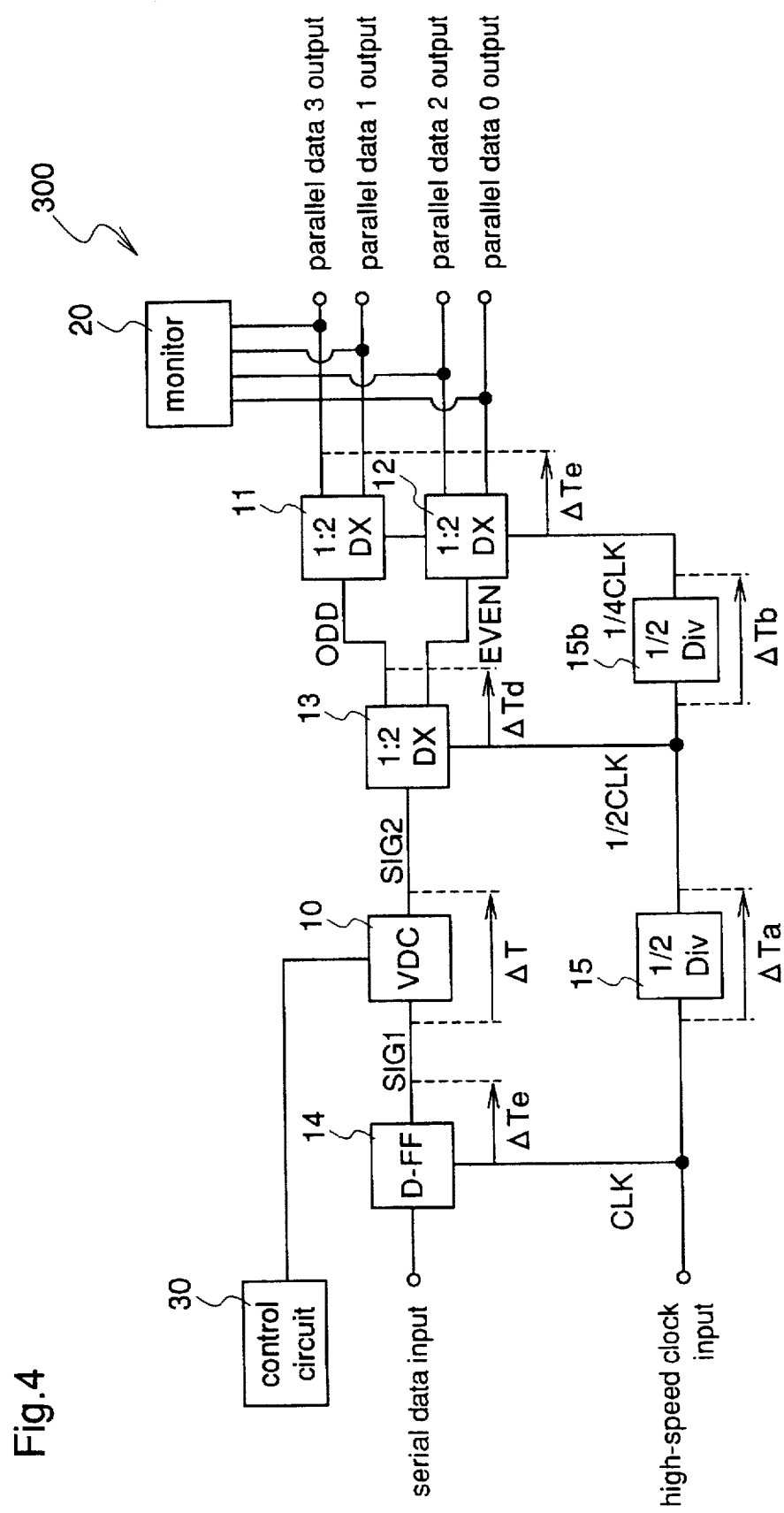
FIG. 4 is a block diagram illustrating a circuit structure of a demultiplexer in accordance with a fourth embodiment of the present invention.
Figure 15:
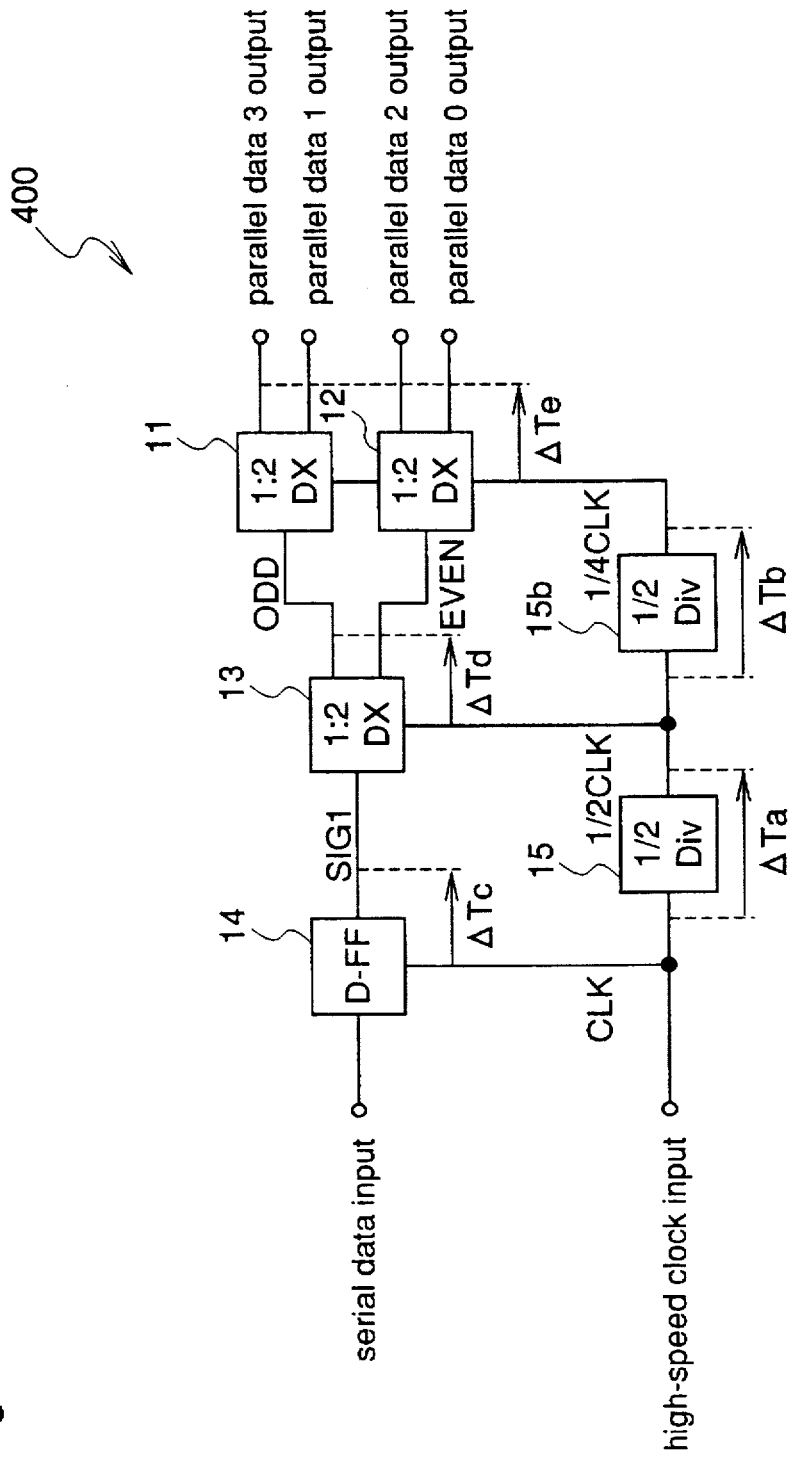
FIG. 15 is a block diagram illustrating a circuit structure of a 1:4 demultiplexer according to the prior art.
Figure 16:
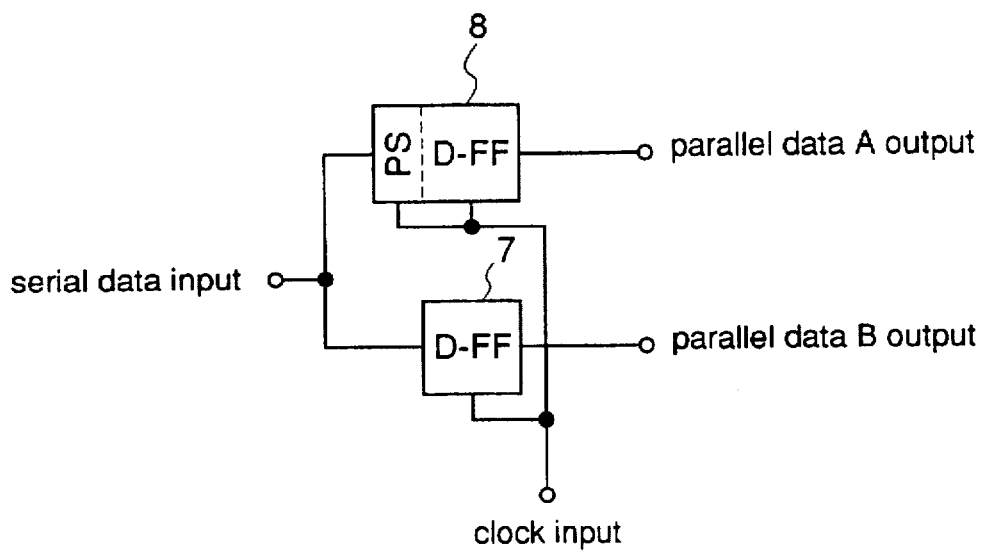
FIG. 16 is a block diagram illustrating a circuit structure of a 1:2 demultiplexer block included in the prior art demultiplexer.
Figure 17:
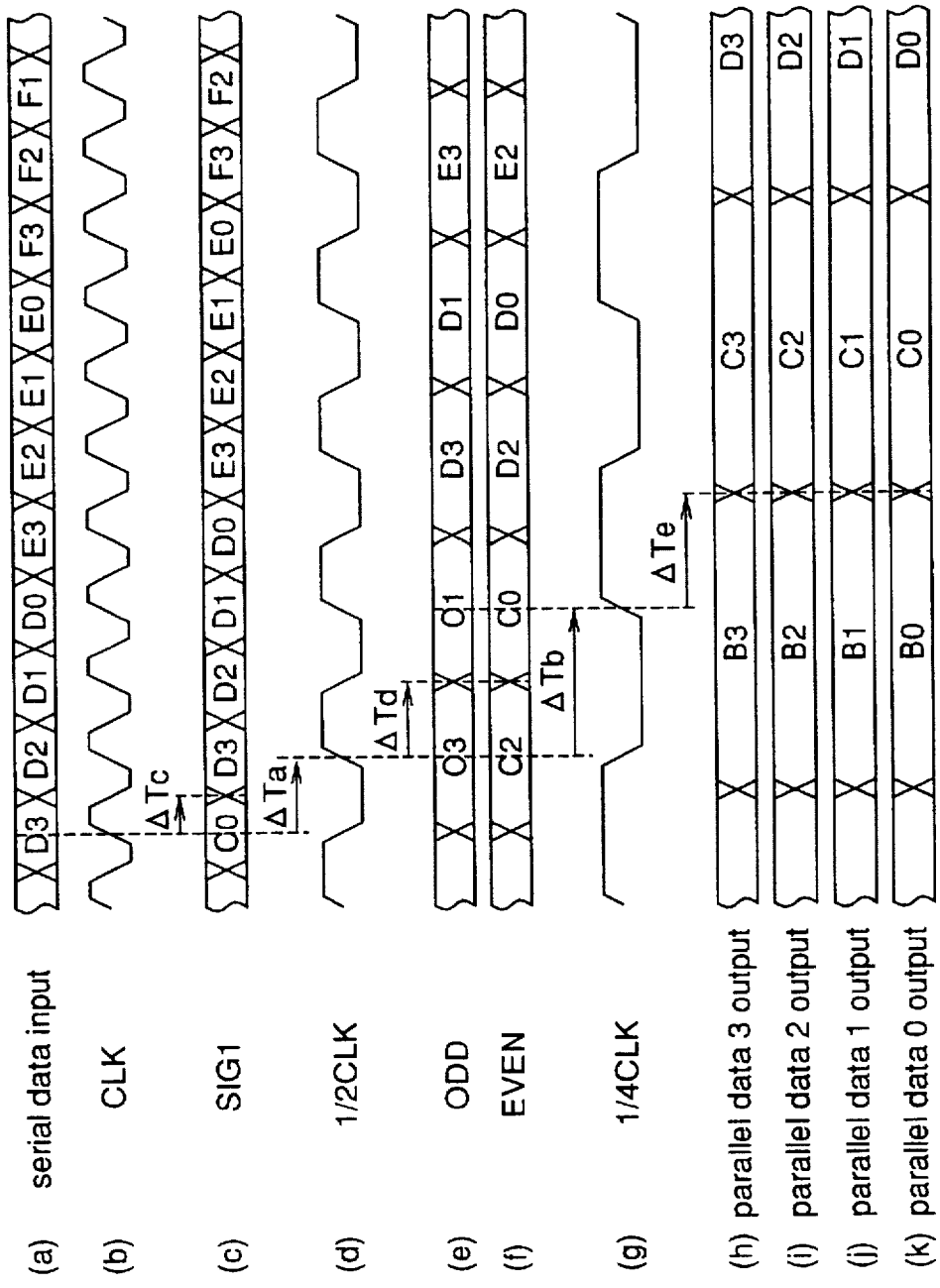
FIGS. 17(a)–17(k) are diagrams illustrating a timing chart of the prior art demultiplexer.
Figure 18:
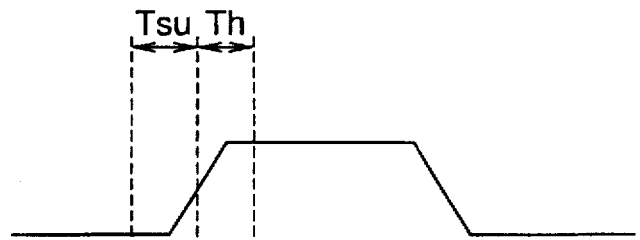
FIGS. 18(a)–18(c) are diagrams illustrating a timing chart of a clock input and a data input in a D flip-flop of the prior art multiplexer.
Figure 18:
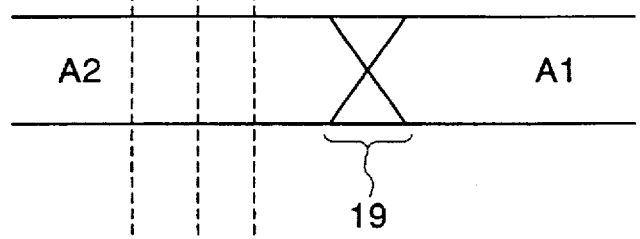
Figure 18:
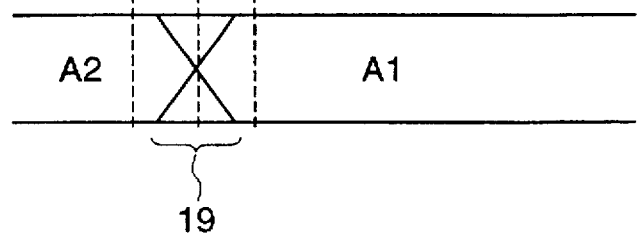

FIG. 4 is a block diagram illustrating a circuit structure of a demultiplexer in accordance with a fourth embodiment of the present invention. In the figure, the same reference numerals as those in FIG. 15 designate the same or corresponding parts. Reference numeral 300 designates a demultiplexer. The demultiplexer 300 comprises a D flip-flop 14, a variable delay circuit 10, a control circuit 30, 1:2 DEMUX blocks 13, 11, and 12, a monitor 20, and ½ frequency dividers 15 and 15b. More specifically, the D flip-flop 14 receives a serial data input and outputs serial data $SIG_1$. The variable delay circuit 10 that can control delay time of an input signal receives the serial data $SIG_1$ output from the D flip-flop 14 and outputs serial data $SIG_2$. The control circuit 30 is connected to the variable delay circuit 10 and controls the variable delay circuit 10 with a control signal that determines the delay time. The 1:2 DEMUX block 13 receives the serial data $SIG_2$ output from the variable delay circuit 10 and converts the serial data $SIG_2$ into two bit parallel data ODD and EVEN. The 1:2 DEMUX blocks 11 and 12 receive the two bit parallel data ODD and EVEN, respectively, and convert the data ODD and EVEN into four bit parallel data 3, 1, 2, and 0. The monitor 20 monitors the outputs from the 1:2 DEMUX blocks 11 and 12 in the final output stage and compares the monitor outputs with expected values which are input in advance. A high-speed clock CLK supplied from outside of the demultiplexer is input to the D flip-flop 14 and to the ½ frequency divider 15. The ½ frequency divider 15 divides the frequency of the high-speed clock CLK and produces a clock ½ CLK. The clock ½ CLK is input to the 1:2 DEMUX block 13 and to the ½ frequency divider 15b. The ½ frequency divider 15b divides the frequency of the clock ½ CLK and produces a clock ¼ CLK. The 1:2 DEMUX blocks 11 and 12 receive the clock ¼ CLK.

Figure 20:
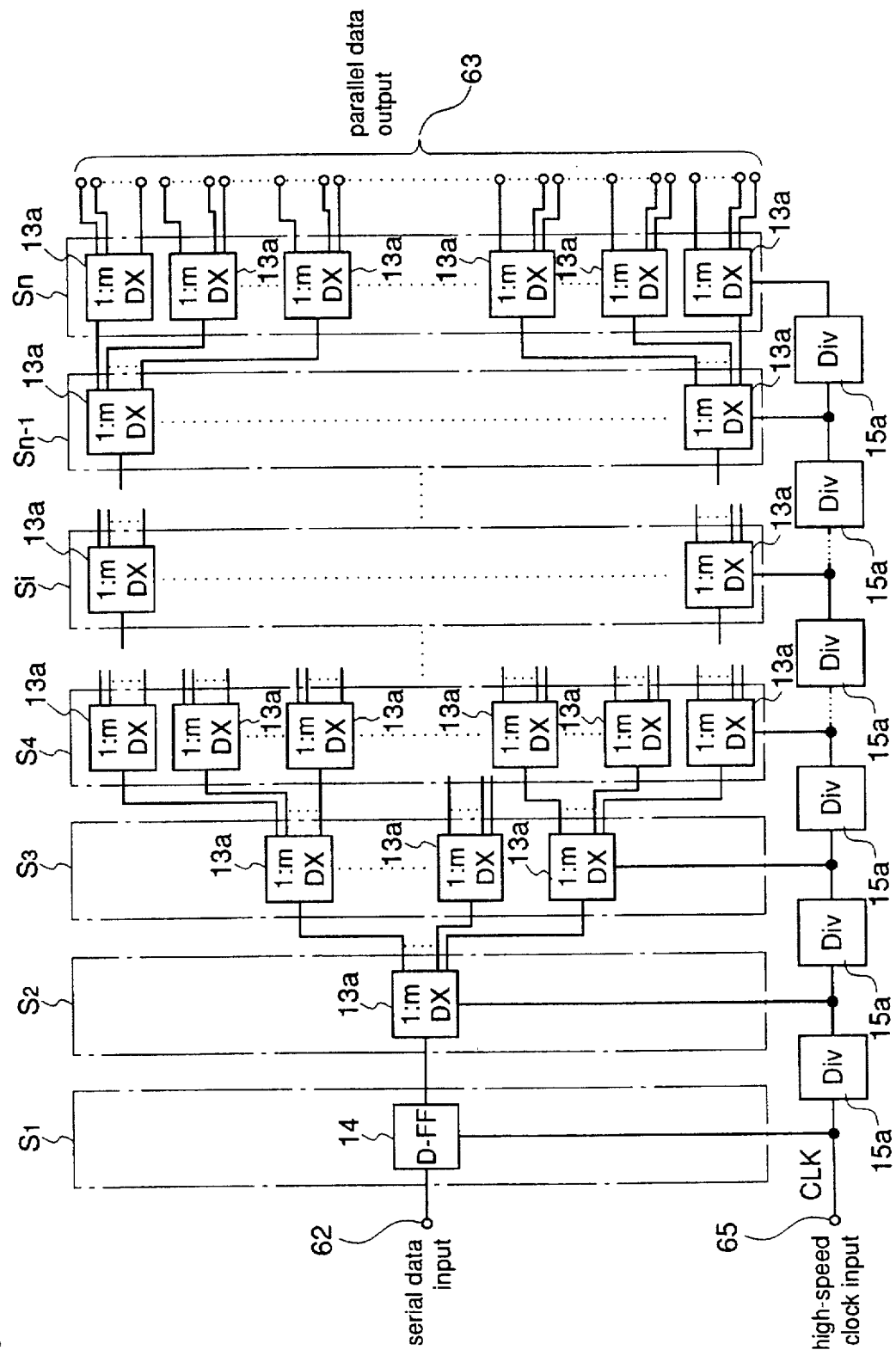
FIG. 20 is a block diagram illustrating a circuit structure of the prior art demultiplexer.

The demultiplexer according to the fourth embodiment of the invention is fundamentally identical to the prior art demultiplexer shown in FIG. 20 in which the first output stage includes the D flip-flop 14 that synchronizes the input serial data with the input clock CLK, and the i-th output stage $S_i$ (i=integer, $2 \leq i \leq n$ (n=integer, $2 \leq n$)) includes $m^{i-2}$ 1:m DEMUX blocks 13a for converting input serial data into m (m=integer, $2 \leq m$) parallel data outputs using a clock signal that is obtained by frequency division of the clock input CLK using the (i−1) frequency dividers 15a. In this structure, the demultiplexer according to the fourth embodiment further includes a monitor 20 for monitoring outputs from the 1:m DEMUX blocks 13a in the final output stage, a variable delay circuit 10 connected between the data output terminal of the D flip-flop 14 in the first stage and the data input terminal of the 1:m DEMUX block 13a in the second stage, and a control circuit 30 for controlling the variable delay circuit 10, whereby the variable delay circuit 10 is controlled in response to a control signal that is output from the control circuit 30 according to the result of the monitoring to adjust the delay time.

Although the demultiplexer 300 according to the fourth embodiment of the invention is a 1:4 demultiplexer, the monitor 20, the variable delay circuit 10, and the control circuit 30 may be applied to a demultiplexer including n stages of 1:m DEMUX blocks as shown in FIG. 20 with the same operating principle and the same effects.

Figure 5:
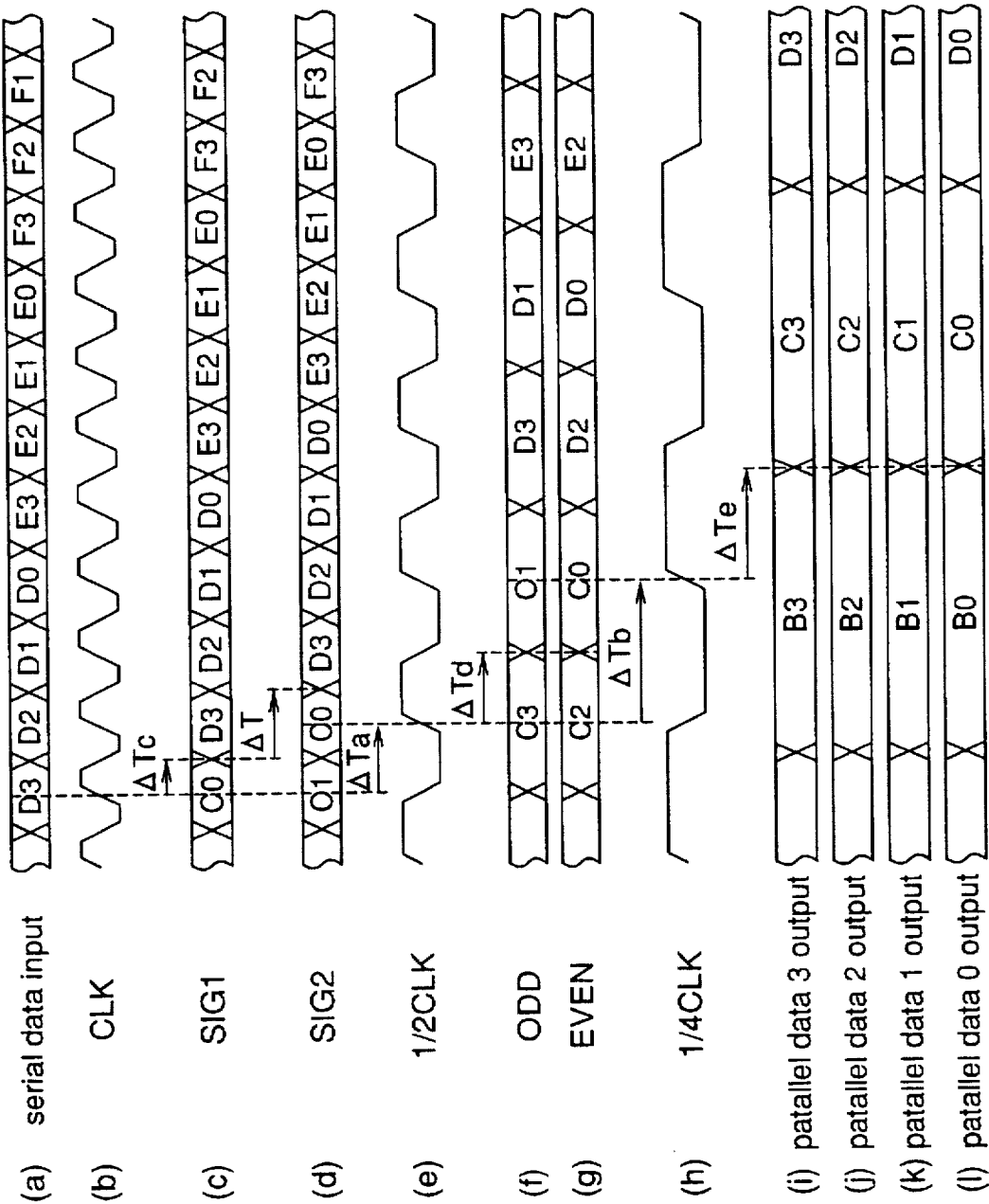
FIGS. 5(a)–5(l) are diagrams illustrating a timing chart of the demultiplexer according to the fourth embodiment of the present invention.

FIGS. 5(a)–5(l) are diagrams illustrating a timing chart of the demultiplexer 300 in accordance with a fourth embodiment of the invention. More specifically, FIGS. 5(i)–5(l) show the timings of the parallel data 3, 2, 1, and 0 output from the demultiplexer, respectively. FIGS. 5(b), 5(e), and 5(h) show the timings of the clocks CLK, ½ CLK, and ¼ CLK, respectively. FIGS. 5(f) and 5(g) show the timings of the parallel data ODD and EVEN, respectively. FIG. 5(c) shows the timing of the serial data $SIG_1$, FIG. 5(d) shows the timing of the serial data $SIG_2$, and FIG. 5(a) shows the timing of the serial data input to the demultiplexer. In the figures, the same reference characters as shown in FIGS. 17(a)–17(k) denote the same or corresponding elements. Reference character ΔT denotes the delay time in the variable delay circuit 10.

A description is given of the operation of the demultiplexer according to the fourth embodiment of the invention. The frequency dividers 15 and 15b receive the high-speed clock CLK and produce a clock ½ CLK having a frequency equivalent to ½ of the frequency of the high-speed clock CLK and a clock ¼ CLK having a frequency equivalent to ¼ of the frequency of the high-speed clock CLK, respectively. The D flip-flop 14 receives the serial data input to the demultiplexer 300, synchronizes the serial data with the high-speed clock CLK, and outputs serial data $SIG_1$. The serial data $SIG_1$ is input to the variable delay circuit 10. The variable delay circuit 10 delays the serial data $SIG_1$ by ΔT and outputs serial data $SIG_2$. The serial data $SIG_2$ is input to the 1:2 DEMUX block 13 in the next stage and converted into two bit parallel data ODD and EVEN. The two bit parallel data ODD and EVEN are input to the 1:2 DEMUX blocks 11 and 12 in the final stage, respectively, and converted into four bit parallel data 3, 1, 2, and 0. Finally, the four bit parallel data are output from the demultiplexer 300.

In the demultiplexer 300, known serial data for test is input to a demultiplexer identical to the demultiplexer 300 according to this fourth embodiment and being kept at a temperature proximate to an actual operating temperature, and the outputs from the final output stage are monitored using the monitor 20. The delay time ΔT of the data in the variable delay circuit 10 is controlled in response to a control signal supplied from the control circuit 30 so that the monitored value becomes equivalent to an expected value for the data output obtained from the serial data for test. In the prior art demultiplexer 400, the delay times of the constituents of the circuit are unfavorably varied due to variations in the process parameters and the temperature, so that the timing of the serial data $SIG_1$ and the clock ½ CLK to be input to the 1:2 DEMUX block 13 varies from the design timing, whereby the D flip-flops 7 and 8 constituting the 1:2 DEMUX block 13 are not operated normally.

In this fourth embodiment of the invention, however, the delay time of the variable delay circuit 10 is adjusted in advance. Therefore, even when the timing of the clock ½ CLK and the data input $SIG_1$ varies from the design timing and the changing point of the data input $SIG_1$ is located between the setup time and the hold time of the D flip-flops 7 and 8 constituting the 1:2 DEMUX block 13, since the deviation of the timing of the serial data $SIG_1$ is adjusted by the variable delay circuit 10 and the timing-adjusted serial data $SIG_2$ is input to the 1:2 DEMUX block 13, the changing point of the data input $SIG_2$ is prevented from being located between the setup time and the hold time of the D flip-flops 7 and 8, whereby the deviation of timing of the data input $SIG_2$ and the clock ½ CLK to be input to the 1:2 DEMUX block 13 is avoided. As a result, the demultiplexer 300 is operated normally. The control of the output signal from the control circuit according to the result of the monitoring may be manually performed. Alternatively, the control of the output signal may be automated with the result of the monitoring in advance.

As described above, in the demultiplexer according to the fourth embodiment of the invention, the first stage includes the D flip-flop for timing control that synchronizes the serial input with the clock input CLK, and the i-th stage (i=integer, $2 \leq i \leq n$ (n=integer, $2 \leq n$)) includes $m^{i-2}$ DEMUX blocks each comprising a plurality of D flip-flops that convert the input serial data into m (m=integer, $2 \leq m$) parallel data outputs in response to the clock obtained by frequency division of the clock CLK. In this structure, each of the $m^{i-2}$ DEMUX blocks in the i-th stage is connected to the prior stage so that one of the parallel data output from the prior stage is input to the DEMUX block as serial data. In addition, the variable delay circuit that can delay the data input, the clock input, or the frequency-divided clock input by a variable delay time is connected to the data input terminal of one of the second to n-th stages, the frequency-divided clock input terminal of one of the second to n-th stages, or the clock input terminal of the first stage. Since the timing of the data input, the clock input, or the frequency-divided clock input is adjusted by the variable delay circuit, even when the timing of the above-described input varies due to variations in the delay time of the constituents of the circuit, the timing is adjusted by the variable delay circuit, whereby the D flip-flops in the stage with the variable delay circuit are normally operated.

More specifically, the variable delay circuit 10 is connected to the data input terminal of the 1:2 DEMUX block 13 in the second stage, and the outputs from the DEMUX blocks 11 and 12 in the final stage are monitored by the monitor 20. The delay time in the variable delay circuit 10 is adjusted by the control circuit 30 according to the monitored values, whereby the timing of the serial data $SIG_1$ output from the D flip-flop 14 is adjusted in the variable delay circuit 10. Therefore, even when the delay times of the constituents of the circuit are varied due to variations in the device parameters or the temperature, the D flip-flop constituting the second stage 1:2 DEMUX block 13 is normally operated by the timing-adjusted serial data.

Furthermore, since the variable delay circuit 10 includes the selector 22 that selects one of the buffer lines 210 comprising the buffers 21 in different numbers and having different delay times, the delay time of the variable delay circuit 10 is easily varied by switching the buffer lines 210 of the selector 22. Therefore, a demultiplexer that is easily adjusted to the normal operating state is provided even when the delay times of the constituents of the circuit are varied.

In this fourth embodiment of the invention, the variable delay circuit 10 is connected to the data input terminal of the 1:2 DEMUX block 13 in the second output stage. However, a similar structure in which the variable delay circuits are connected to the data input terminals of the DEMUX blocks constituting any of other output stages, except the first stage, is also within the scope of the invention. In this case, the variable delay circuits must be connected to the data input terminals of all of the D flip-flops constituting the output stage.

[Embodiment 5]

Figure 6:
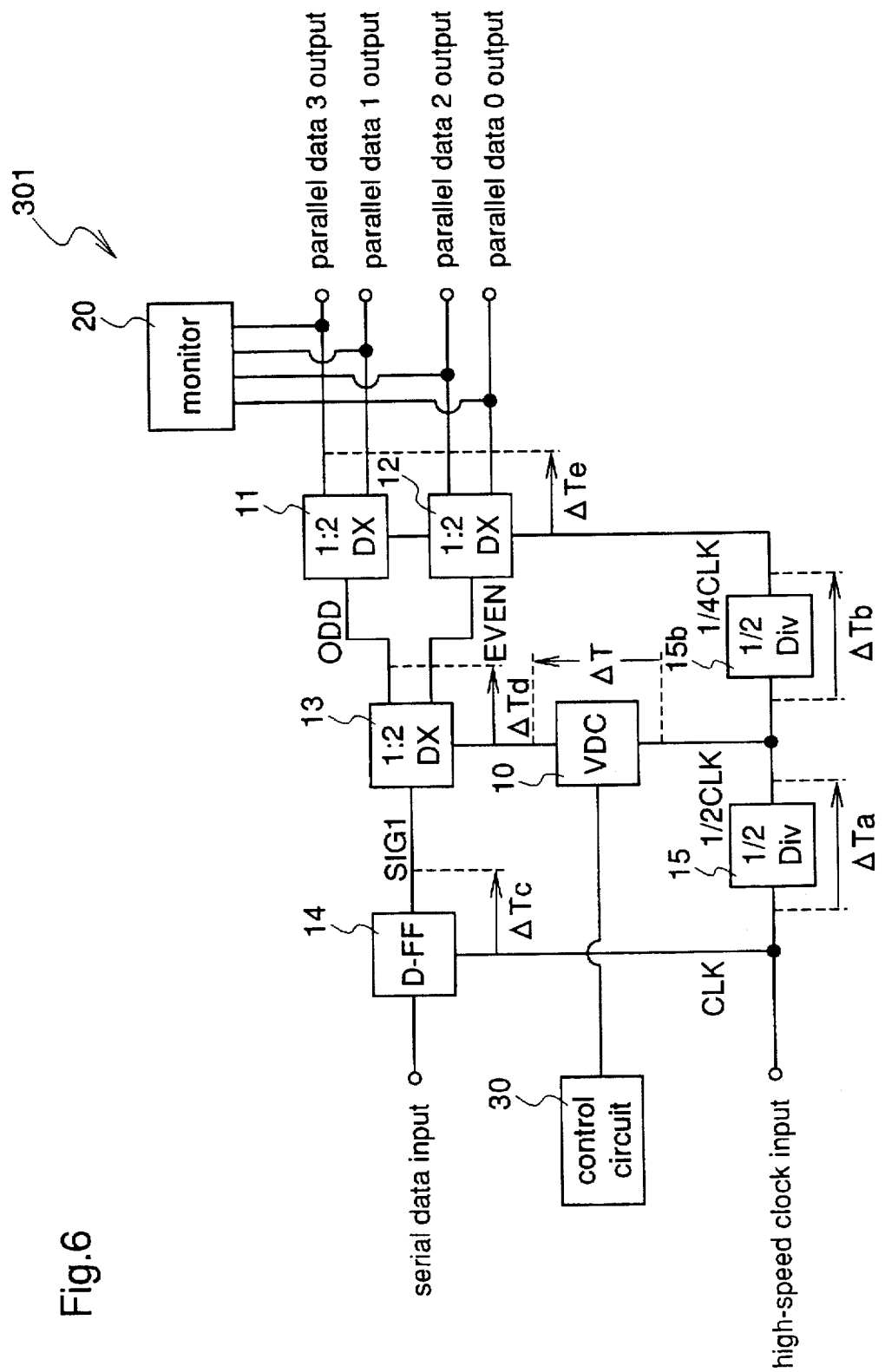
FIG. 6 is a block diagram illustrating a circuit structure of a demultiplexer in accordance with a fifth embodiment of the present invention.

FIG. 6 is a block diagram illustrating a circuit structure of a demultiplexer in accordance with a fifth embodiment of the present invention. In the figure, the same reference numerals as those shown in FIG. 15 designate the same or corresponding parts. A demultiplexer 301 according to the fifth embodiment comprises a D flip-flop 14, a variable delay circuit 10, a control circuit 30, 1:2 DEMUX blocks 11, 12, and 13, a monitor 20, and ½ frequency dividers 15 and 15b. More specifically, the D flip-flop 14 receives a serial data input and outputs serial data $SIG_1$. The 1:2 DEMUX block 13 receives the serial data $SIG_1$ and converts the serial data $SIG_1$ into two bit parallel data ODD and EVEN. The 1:2 DEMUX blocks 11 and 12 receive the two bit parallel data ODD and EVEN, respectively, and convert the data ODD and EVEN into four bit parallel data 3, 1, 2, and 0. The monitor 20 monitors the outputs from the 1:2 DEMUX blocks 11 and 12 in the final output stage and compares the monitored outputs with expected values which are input in advance. A high-speed clock CLK supplied from the outside of the demultiplexer is input to the D flip-flop 14 and to the ½ frequency divider 15. The ½ frequency divider 15 divides the frequency of the high-speed clock CLK and produces a clock ½ CLK. The clock ½ CLK is input to the variable delay circuit 10 that can control the delay time of the input signal at variable values. The variable delay circuit 10 delays the clock ½ CLK and outputs the clock to the 1:2 DEMUX block 13. The control circuit 30 is connected to the variable delay circuit 10. The control circuit 30 controls the variable delay circuit 10 with a control signal that determines the delay time. The ½ frequency divider 15b divides the frequency of the clock ½ CLK output from the ½ frequency divider 15 and produces a clock ¼ CLK. The clock ¼ CLK is input to the 1:2 DEMUX blocks 11 and 12.

The demultiplexer 301 according to this fifth embodiment is fundamentally identical to the demultiplexer 300 according to the fourth embodiment except that the variable delay circuit 10 is connected to the clock input terminal of the 1:m DEMUX block 13 in the second stage and the variable delay circuit 10 delays the frequency-divided clock input to the 1:m DEMUX block 13 at variable values.

A description is given of the operation of the 1:4 demultiplexer 301 shown in FIG. 6. In the fourth embodiment of the invention, when the timing of the clock ½ CLK and the data input $SIG_1$ to be input to the 1:2 DEMUX block 13 is varies from the design timing, the timing of the serial data output from the D flip-flop 14 is adjusted with a control signal supplied from the control circuit 30 to the variable delay circuit 10, whereby the 1:2 DEMUX block 13 is normally operated. On the other hand, in this fifth embodiment, when the timing of the clock ½ CLK and the data input $SIG_1$ to be input to the 1:2 DEMUX block 13 varies from the design timing, the clock ½ CLK is delayed, i.e., adjusted, by the variable delay circuit 10 and the adjusted clock is input to the clock input terminal of the 1:2 DEMUX block 13, whereby the timing of the clock ½ CLK and the data input $SIG_1$ is approximates to the design timing.

More specifically, the frequency dividers 15 and 15b produce a clock ½ CLK having a frequency equivalent to ½ of the frequency of the high-speed clock CLK and a clock ¼ CLK having a frequency equivalent to ¼ of the frequency of the high-speed clock CLK, respectively. The D flip-flop 14 synchronizes the serial data input to the demultiplexer 301 with the high-speed clock CLK and outputs the serial data $SIG_1$. The serial data $SIG_1$ is input to the 1:2 DEMUX block 13 in the next stage. The clock ½ CLK is delayed by ΔT in the variable delay circuit 10 and the delayed ½ CLK is input to the 1:2 DEMUX block 13. Receiving the delayed ½ CLK and the serial data $SIG_1$, the 1:2 DEMUX block 13 synchronizes the serial data $SIG_1$ with the delayed ½ CLK and converts the serial data $SIG_1$ into two bit parallel data ODD and EVEN. Finally, the two bit parallel data ODD and EVEN are input to the 1:2 DEMUX blocks 11 and 12, respectively, and are converted into four bit parallel data 3, 2, 1, and 0.

In the demultiplexer 301 according to the fifth embodiment of the invention, known serial data for test is input to a demultiplexer identical to the demultiplexer 301 and kept at a temperature proximate to an actual operating temperature, and the outputs from the final output stage are monitored using the monitor 20. The delay time $\Delta T$ of the data in the variable delay circuit 10 is adjusted in response to a control signal supplied from the control circuit 30 so that the monitored value becomes equivalent to an expected value for the data output obtained from the serial data for test. In the prior art demultiplexer 400, the delay times of the constituents of the circuit are unfavorably varied due to variations in the process parameters and the temperature, so that the timing of the serial data $SIG_1$ and the clock ½ CLK to be input to the 1:2 DEMUX block 13 unfavorably varies from the design timing, whereby the D flip-flops 7 and 8 constituting the 1:2 DEMUX block 13 are not operated normally.

In this fifth embodiment of the invention, however, the delay time of the variable delay circuit 10 is adjusted in advance. Therefore, even when the timing of the clock ½ CLK and the data input $SIG_1$ varies from the design timing and the changing point of the data input $SIG_1$ is located between the setup time and the hold time of the D flip-flops 7 and 8 constituting the 1:2 DEMUX block 13, since the deviation of the timing of the clock ½ CLK is adjusted by the variable delay circuit 10 and the timing-adjusted clock ½ CLK is input to the 1:2 DEMUX block the changing point of the data input $SIG_1$ is prevented from being located between the setup time and the hold time of the D flip-flops 7 and 8, whereby variation of the timing of the data input $SIG_1$ and the clock ½ CLK to be input to the 1:2 DEMUX block 13 in the second stage is avoided. As a result, the demultiplexer 301 is operated normally. The control of the output signal from the control circuit according to the result of the monitoring may be manually performed. Alternatively, the control of the output signal may be automated with the result of the monitoring in advance.

As described above, in the demultiplexer 301 according to the fifth embodiment of the present invention, the variable delay circuit 10 is connected to the clock input terminal of the 1:2 DEMUX block 13 in the second stage, and the outputs from the 1:2 DEMUX blocks 11 and 12 in the final output stage are monitored by the monitor 20. The delay output time of the variable delay circuit 10 is adjusted by the control circuit 30 according to the monitored values, whereby the timing of the clock ½ CLK that is output from the ½ frequency divider 15 is adjusted in the variable delay circuit 10. Therefore, even when the delay times of the constituents of the circuit vary due to variations in the device parameters or the temperature, the D flip-flop constituting the 1:2 DEMUX block 13 in the second stage is normally operated by the timing-adjusted clock, resulting in a normally operated demultiplexer.

Furthermore, since the variable delay circuit 10 includes the selector 22 that selects one of the buffer lines 210 comprising the buffers 21 in different numbers and having different delay times, the delay time of the variable delay circuit 10 is easily varied by switching the buffer lines 210 of the selector 22. Therefore, a demultiplexer that is easily adjusted to the normal operating state is provided even when the delay times of the constituents of the circuit are varied.

In this fifth embodiment of the invention, the variable delay circuit 10 is connected to the frequency-divided clock input terminal of the 1:2 DEMUX block 13 in the second output stage. However, a similar structure in which the variable delay circuits are connected to the clock input terminals or the frequency-divided clock input terminals of the 1:2 DEMUX blocks constituting any of other output stages is also within the scope of the invention. In this case, the variable delay circuits 10 must be connected to the clock input terminals or the frequency-divided-clock input terminals of all of the D flip-flops constituting the output stage.

[Embodiment 6]

Figure 11:
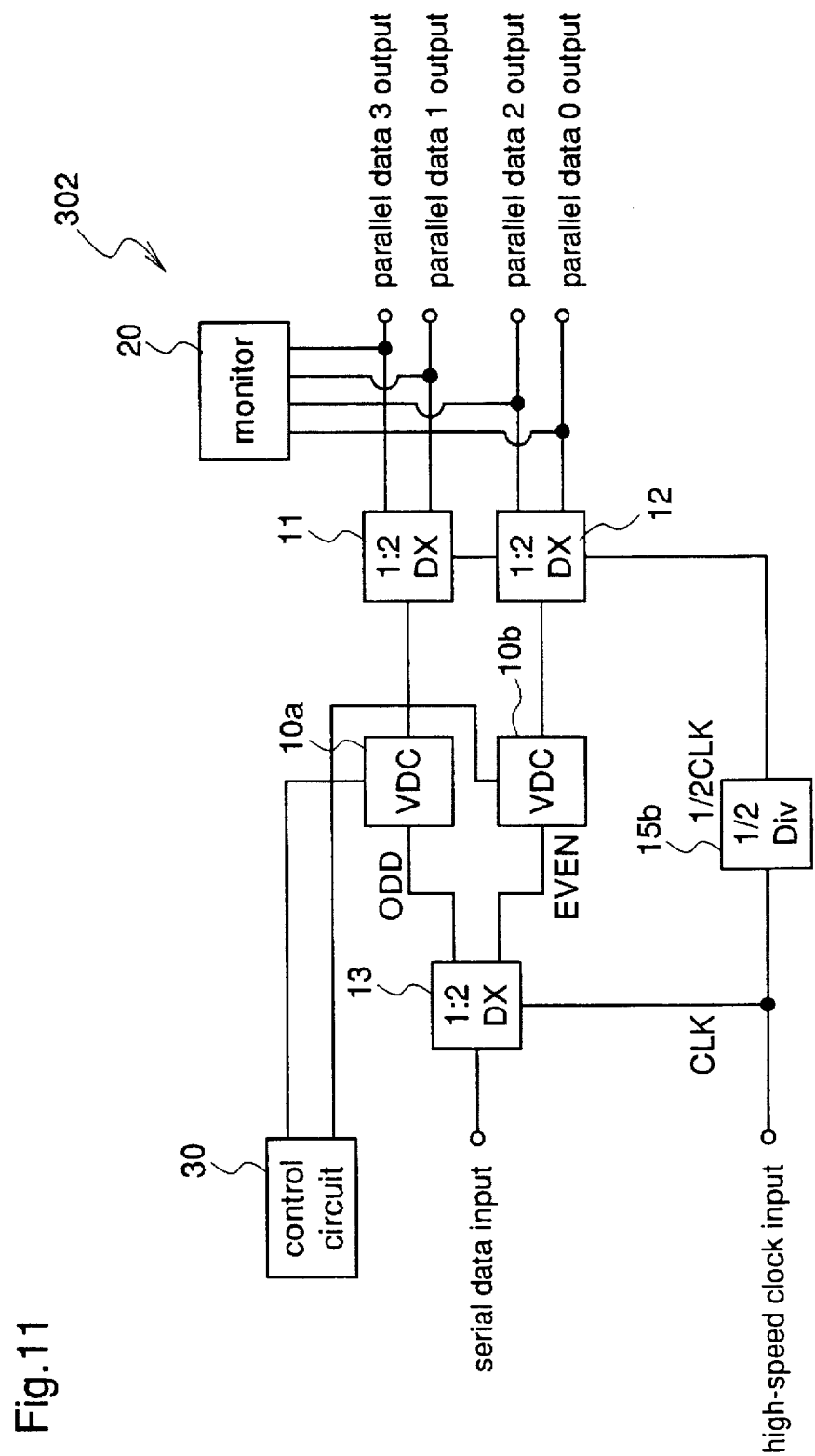
FIG. 11 is a block diagram illustrating a circuit structure of a demultiplexer in accordance with a sixth embodiment of the present invention.

FIG. 11 is a block diagram illustrating a demultiplexer in accordance with a sixth embodiment of the present invention. In the figure, the same reference numerals as those in FIG. 6 designate the same or corresponding parts. A demultiplexer 302 comprises variable delay circuits 10a and 10b, a control circuit 30, 1:2 DEMUX blocks 11, 12, and 13, a monitor 20, and a ½ frequency divider 15b. More specifically, the 1:2 DEMUX block 13 receives serial data and converts the serial data into two bit parallel data ODD and EVEN. The parallel data ODD and EVEN are input to the variable delay circuits 10a and 10b, respectively, and delayed in the variable delay circuits. The variable delay circuits 10a and 10b are identical to the variable delay circuit 10 shown in FIG. 7 and are capable of varying the delay time of the input signal. The control circuit 30 is connected to the variable delay circuits 10a and 10b and controls the variable delay circuits 10a and 10b with a control signal that determines the delay time. The 1:2 DEMUX blocks 11 and 12 receive the delayed parallel data ODD and EVEN, respectively, and convert the parallel data into four bit parallel data 3, 1, 2, and 0. The monitor 20 monitors the outputs from the 1:2 DEMUX blocks 11 and 12 in the final output stage and compares the monitored values with expected values that are input to the monitor in advance. The ½ frequency divider 15b receives a high-speed clock CLK and divides the frequency of the clock CLK to produce a clock ½ CLK. The clock ½ CLK is input to the 1:2 DEMUX blocks 11 and 12.

The demultiplexer 302 according to this sixth embodiment is fundamentally identical to the demultiplexer 300 according to the fourth embodiment except that the demultiplexer 302 includes the 1:2 DEMUX block 13 in the first stage and the variable delay circuits 10a and 10b that are connected to the data input terminals of the 1:2 DEMUX blocks 11 and 12 in the second stage, respectively. The demultiplexer 300 according to the fourth embodiment includes the D flip-flop 14 that synchronizes the serial data input with the high-speed clock CLK in the first stage and the variable delay circuit 10 that is connected to the data input terminal of the 1:2 DEMUX block 13 in the second stage. Also in this sixth embodiment, the data input to the second stage 1:2 DEMUX blocks 11 and 12 are variably delayed in the variable delay circuits 10a and 10b, respectively.

A description is given of the operation of the 1:4 demultiplexer 302 shown in FIG. 11.

The 1:2 DEMUX block 13 in the first stage synchronizes the serial data input with the high-speed clock CLK and converts the serial data into two bit parallel data ODD and EVEN. The two bit parallel data ODD and EVEN are delayed in the variable delay circuits 10a and 10b, and the delayed parallel data ODD and EVEN are input to the 1:2 DEMUX blocks 11 and 12 in next stage, respectively. Since the clock ½ CLK having a frequency equivalent to the half of the frequency of the high-speed clock CLK is input to the 1:2 DEMUX blocks 11 and 12 as a clock signal, the delayed parallel data ODD and EVEN are synchronized with the clock ½ CLK and converted into four bit parallel data 3, 2, 1, and 0. Finally, the four bit parallel data are output from the demultiplexer 302.

In the demultiplexer 302 according to the sixth embodiment of the invention, known serial data for test is input to a demultiplexer identical to the demultiplexer 302 and kept at a temperature proximate to an actual operating temperature, and the outputs from the final output stage are monitored using the monitor 20. The delay time ΔT of the data in the variable delay circuits 10a and 10b is adjusted in response to a control signal supplied from the control circuit 30 so that the monitored value becomes equivalent to an expected value for the data output obtained from the serial data for test. In the prior art demultiplexer 400, the delay times of the constituents of the circuit are unfavorably varied due to variations in the process parameters and the temperature, so that the timing of the serial data SIG$_1$ and the clock ½ CLK to be input to the 1:2 DEMUX block 13 is unfavorably varies from the design timing, whereby the D flip-flops 7 and 8 constituting the 1:2 DEMUX blocks 11 and 12 are not operated normally.

In this sixth embodiment of the invention, however, the delay time of the variable delay circuits 10a and 10b is adjusted in advance. Therefore, even when the timing of the two bit parallel data and the clock ½ CLK to be input to the 1:2 DEMUX blocks 11 and 12 varies from the design timing and the changing point of the two bit data is located between the setup time and the hold time of the D flip-flops 7 and 8 constituting the 1:2 DEMUX blocks 11 and 12, since the variable delay circuits 10a and 10b delay the two bit parallel data so that the timing of the two bit parallel data and the clock ½ CLK is adjusted and the delayed two bit data are input to the 1:2 DEMUX blocks 11 and 12, the changing point of the two bit data is prevented from being placed between the setup time and the hold time of the D flip-flops 7 and 8 in the 1:2 DEMUX blocks 11 and 12, whereby deviation of the timing of the two bit data and the clock ½ CLK to be input to the 1:2 DEMUX blocks 11 and 12 is avoided. As a result, the demultiplexer 302 is normally operated. Also in this sixth embodiment, the control of the output signal from the control circuit according to the result of the monitoring may be manually performed. Alternatively, the control of the output signal may be automated with the result of the monitoring in advance.

As described above, in the demultiplexer 302 according to the sixth embodiment of the present invention, the variable delay circuits 10a and 10b are connected to the data input terminals of the 1:2 DEMUX blocks 11 and 12 in the second stage, respectively, and the outputs from the 1:2 DEMUX blocks 11 and 12 are monitored by the monitor 20. The delay time of the variable delay circuits 10a and 10b is adjusted by the control circuit 30 according to the monitored values, whereby the timing of the two bit parallel data output from the 1:2 DEMUX block 13 is adjusted. Therefore, even when the delay times of the constituents of the circuit are varied due to variations in the device parameters or the temperature, the D flip-flops constituting the second stage 1:2 DEMUX blocks 11 and 12 are normally operated by the timing-adjusted parallel data, resulting in a normally operated demultiplexer.

In this sixth embodiment, the variable delay circuits 10a and 10b are connected to the data input terminals of the DEMUX blocks 11 and 12 constituting the second output stage. However, a similar structure in which the variable delay circuits are connected to the clock input terminals or the frequency-divided clock input terminals of the DEMUX blocks constituting any output stage is within the scope of the invention. In this case, the variable delay circuits must be connected to the clock input terminals or the frequency-divided clock input terminals of all of the D flip-flops constituting the output stage. Likewise, a similar structure in which the variable delay circuits are connected to the data input terminals of the DEMUX blocks constituting any of other output stages, except the first stage, is also within the scope of the invention. In this case, the variable delay circuits must be connected to the data input terminals of all of the D flip-flops constituting the output stage.

Furthermore, since the variable delay circuit 10 includes the selector 22 that selects one of the buffer lines 210 comprising the buffers 21 in different numbers and having different delay times, the delay time of the variable delay circuit 10 is easily varied by switching the buffer lines 210 of the selector 22. Therefore, a demultiplexer that is easily adjusted to the normal operating state is provided even when the delay times of the constituents of the circuit are varied.

[Embodiment 7]

Figure 8:
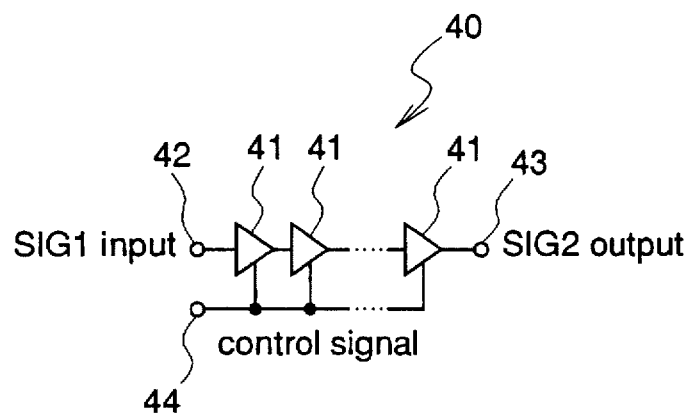
FIG. 8 is a block diagram illustrating a variable delay circuit included in the multiplexer in accordance with a seventh embodiment of the invention.

FIG. 8 is a block diagram illustrating a variable delay circuit used in a multiplexer or a demultiplexer in accordance with a seventh embodiment of the present invention. In the figure, a variable delay circuit 40 comprises a plurality of variable delay buffers 41 connected in series, a data input terminal 42 to which data to be delayed is input, a data output terminal 43 from which delayed data is output, and a control signal input terminal 44. The number of the variable delay buffers 41 depends on the length of the delay time. The data input terminal 42 is connected to an input terminal of the first stage variable delay buffer 41, and the data output terminal 43 is connected to an output terminal of the final stage variable delay buffer 41. The control signal input terminal 44 is connected to control signal input terminals of the variable delay buffers 41 and supplies delay time control signals to the variable delay buffers 41.

Figure 9:
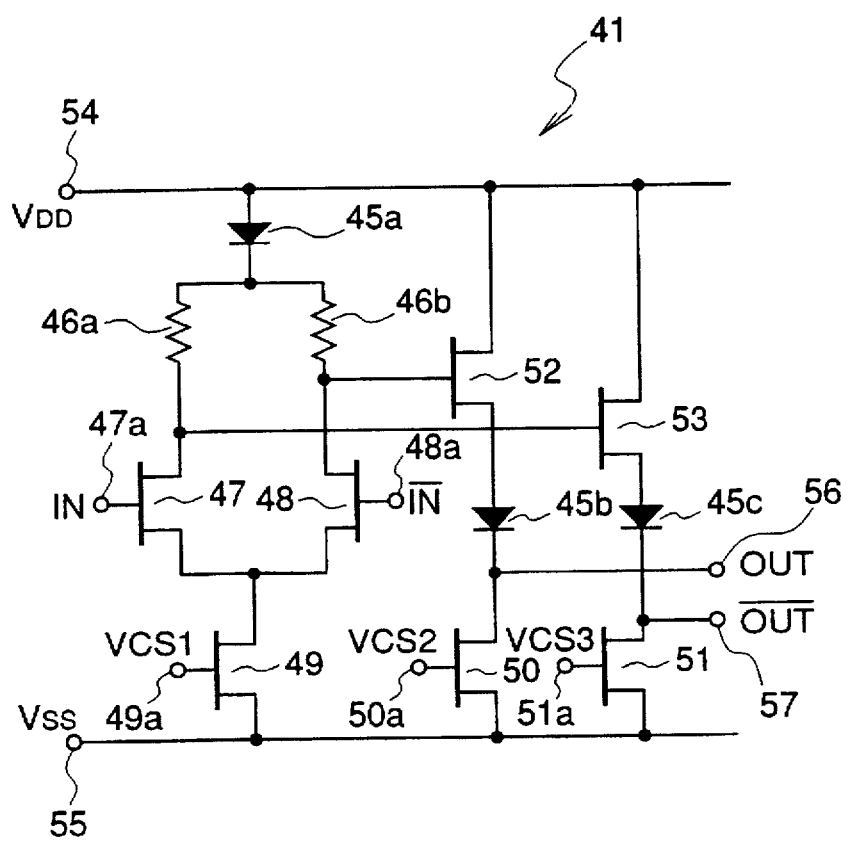
FIG. 9 is a block diagram illustrating a circuit structure of a variable delay buffer included in the variable delay circuit according to the seventh embodiment of the invention.

FIG. 9 is a block diagram illustrating the circuit structure of the variable delay buffer 41 shown in FIG. 8. The variable delay buffer 41 comprises a terminal 54 to which a supply voltage $V_{DD}$ is applied, diodes 45a to 45c each having an anode and a cathode, resistors 46a and 46b, field effect transistors (hereinafter referred to as FETs) 47 to 53 each having a gate, a drain, and a source, a terminal 55 to which a supply voltage $V_{SS}$ is applied, and data output terminals 56 and 57. Reference numerals 47a to 51a designate gate terminals of the FETs 47 to 51, respectively. More specifically, the anode of the diode 45a is connected to the supply voltage $V_{DD}$, and the cathode of the diode 45a is connected to an end of the resistor 46a and to an end of the resistor 46b. The other end of the resistor 46a is connected to the drain of the FET 47, and the other end of the resistor 46b is connected to the drain of the FET 48. A data input IN is input to the gate terminal 47a of the FET 47, and a data input $\overline{\text{IN}}$ is input to the gate terminal 48a of the FET 48. The sources of the FETs 47 and 48 are connected to the drain of the FET 49. The source of the FET 49 is connected to the supply voltage $V_{SS}$. The drain of the FET 52 is connected to the supply voltage $V_{DD}$, and the gate of the FET 52 is connected to the junction of the resistor 46b and the FET 48. The anode of the diode 45b is connected to the source of the FET 52. The drain of the FET 53 is connected to the supply voltage $V_{DD}$, and the gate of the FET 53 is connected to the junction of the resistor 46b and the FET 47. The anode of the diode 45c is connected to the source of the FET 53. The cathodes of the diodes 45b and 45c are connected to the data output terminals 56 and 57, respectively. Data outputs OUT and $\overline{\text{OUT}}$ are output from the data output terminals 56 and 57, respectively. The drain and the source of the FET 50 are connected to the data output terminal 56 and the supply voltage $V_{SS}$, respectively. The drain and the source of the FET 51 are connected to the data output terminal 57 and the supply voltage $V_{SS}$, respectively.

The FETs 49, 50, and 51 are current supply transistors, and gate voltages $V_{CS1}$, $V_{CS2}$, and $V_{CS3}$ are applied to the gate terminals 49a, 50a, and 51a, respectively. The gate terminals 49a and 50a are connected to the control signal input terminal 44 shown in FIG. 8, and the gate voltages $V_{CS2}$ and $V_{CS3}$ are controlled by the control circuit 30.

In this seventh embodiment of the present invention, in the multiplexer according to any of the first to third embodiments of the invention or the demultiplexer according to any of the fourth to sixth embodiments of the invention, in place of the variable delay circuit 10 shown in FIG. 7, the variable delay circuit 40 comprising the variable delay buffers 41 as shown in FIG. 8 is employed.

A description is given of the operation of the variable delay circuit 40 according to this seventh embodiment of the invention. The variable delay circuit 40 includes a plurality of variable delay buffers 41 between the data input terminal 42 to which the data $SIG_1$ is input and the data output terminal 43 from which the data $SIG_2$ is output, and the delay time of the data in the variable delay buffers is controlled in response to controlled signals applied to the control signal input terminal 44 from the control circuit 30.

The variable delay buffer 41 is a source follower buffer as shown in FIG. 9. The data differentially input to the data input terminals 47a and 48a are differentially amplified in the FETs 47 and 48 and sent to the FETs 53 and 52, respectively. The data are subjected to impedance conversion in the FETs 53 and 52 and output from the data output terminals 57 and 56, respectively. In this variable delay buffer 41, the magnitude of the current flowing in the source follower buffer comprising the FETs 52 and 53 is controlled by simultaneously changing the gate voltages $V_{CS2}$ and $V_{CS3}$ at the gate terminals 50a and 50b of the FETs 50 and 51, respectively, using the control circuit 30, whereby the delay times of the data OUT and $\overline{OUT}$ that are output from the data output terminals 56 and 57, respectively, are controlled.

The variable delay circuit 40 comprises a plurality of variable delay buffers 41 which control the delay time as described above, so that the delay times as many as the number of the buffers 41 are accumulated. Therefore, the data $SIG_1$ input to the data input terminal 42 is delayed by a time interval according to the number of the variable delay buffers 41 which are connected in series and the control signals applied to the control signal input terminal, and the delayed data is output from the data output terminal 43 as a data output $SIG_2$.

As described above, in this seventh embodiment of the invention, the variable delay circuit 40 comprises a plurality of variable delay buffers 41, and the delay time of the data in the variable delay circuit 40 is controlled by the control circuit 30. Therefore, the delay time of the variable delay circuit 40 is easily controlled by switching the control signal from the control circuit 30. As a result, a multiplexer or a demultiplexer that can be adjusted to the normal operating state even when the delay times of the constituents of the circuit are varied is provided.

In the seventh embodiment of the invention, the delay time of the variable delay buffers 41 is controlled by varying the gate voltages $V_{CS2}$ and $V_{CS3}$ of the FETs 50 and 51 using the control circuit 30. However, the control of the delay time may be performed by varying the gate voltage $V_{CS1}$ at the gate terminal 49a of the FET 49 to change the logical amplitude of the variable delay buffer 41. Also in this case, the same effects as described above are achieved.

In the seventh embodiment of the invention, the variable delay circuit 40 includes the SCFL (Source Coupled FET Logic) variable delay buffers 41. However, a similar structure including BFL (Buffered FET Logic) or ECL (Emitter Coupled FET Logic) variable delay buffers is within the scope of the present invention.

Further, although a double-phase driving source follower buffer is employed for the variable delay buffer 41, a single-phase driving source follower buffer may be employed with the same effects as described above.

Further, although the delay time of the variable delay buffer 41 is controlled by simultaneously controlling the gate voltages $V_{CS2}$ and $V_{CS3}$ with a control signal, the delay time may be controlled by separately controlling the gate voltages $V_{CS2}$ and $V_{CS3}$ and changing the cross point of the gate voltages $V_{CS2}$ and $V_{CS3}$. Also in this case, the same effects as described above are achieved.

Furthermore, although the delay time of the variable delay buffer 41 is controlled with the gate voltages $V_{CS2}$ and $V_{CS3}$, the delay time may be controlled by varying the supply voltages $V_{DD}$ and $V_{SS}$ using the control circuit 30 to control the magnitude of current.

Furthermore, in the seventh embodiment of the invention, a multiplexer similar to the multiplexer according to the first embodiment and employing the delay control circuit 40 comprising the variable delay buffers 41 in place of the delay control circuit 10 is described. However, the delay control circuit 40 according to this seventh embodiment may be applied to the multiplexers according to the second and third embodiments and the demultiplexers according to the fourth to sixth embodiments with the same effects as described above.

What is claimed is:

1. A multiplexer comprising:

an n-th stage as a final output stage (n=integer, $2 \leq n$);

j stages (j=integer, $1 \leq j \leq n-1$), the n-th stage including a D flip-flop having a clock input terminal for receiving a first clock signal, a data input terminal for receiving serial data, and a data output terminal, the D flip-flop synchronizing the serial data with the first clock signal, a j-th stage including $m^{n-j-1}$ (m=integer, $2 \leq m$) multiplexer blocks, each multiplexer block comprising a plurality of D flip-flops and having data input terminals for receiving m inputs of parallel data and a clock input terminal for receiving a second clock signal produced by frequency division of the first clock signal, each multiplexer block converting parallel data into serial data in response to the second clock signal, a multiplexer block in the j-th stage being connected to a multiplexer block in the (j+1)-th stage so that the serial data output from a multiplexer block in the j-th stage is applied as parallel data input to a multiplexer block in the (j+1)-th stage; and a variable delay circuit connected to a data input terminal of each multiplexer block in one of the second to the n-th stages, the variable delay circuit delaying data input by a variable delay time.

2. The multiplexer of claim 1 further including:

means for monitoring data output from the data output terminal of the D flip-flop in the n-th stage; and means for controlling the delay time of the variable delay circuit with a control signal in response to the monitoring.

3. The multiplexer of claim 2 wherein the variable delay circuit comprises:

a plurality of lines respectively comprising different numbers of buffers providing different delay times, the lines being arranged in parallel with each other; and a selector for selecting one of the lines in response to the control signal supplied from the means for controlling the delay time, the selector being connected to the lines and to the means for controlling delay time.

4. The multiplexer of claim 2 wherein the variable delay circuit comprises at least a variable delay buffer connected to the means for controlling the delay time for varying the variable delay time in response to the control signal.

5. The multiplexer of claim 4 wherein the variable delay buffer comprises a source follower buffer including a current supply transistor in which the delay time is controlled by controlling a gate voltage of the current supply transistor with the control signal supplied from the means for controlling the delay time.

6. A multiplexer comprising:

an n-th stage as a final output stage (n=integer, $2 \leq n$);

j stages (j=integer, $1 \leq j \leq n-1$), the n-th stage including a D flip-flop having a clock input terminal for receiving a first clock signal, a data input terminal for receiving serial data, and a data output terminal, the D flip-flop synchronizing the serial data with the first clock signal, a j-th stage including $m^{n-j-1}$ (m=integer, $2 \leq m$) multiplexer blocks, each multiplexer block comprising a plurality of D flip-flops and having data input terminals for receiving m inputs of parallel data and a clock input terminal for receiving a second clock signal produced by frequency division of the first clock signal, each multiplexer block converting parallel data into serial data in response to the second clock signal, a multiplexer block in the j-th stage being connected to a multiplexer block in the (j+1)-th stage so that the serial data output from a multiplexer block in the j-th stage is applied as parallel data input to a multiplexer block in the (j+1)-th stage; and a variable delay circuit connected to the clock input terminal of each multiplexer block in one of the first to the (n−1)th stages or to the clock input terminal of the D flip-flop in the n-th stage, the variable delay circuit delaying the clock input by a variable delay time.

7. A multiplexer comprising:

an n-th stage as a final stage (n=integer, $2 \leq n$);

h stages (h=integer, $1 \leq h \leq n-1$), the n-th stage including a multiplexer block comprising a plurality of D flip-flops and having a clock input terminal for receiving a first clock signal, a data input terminal for receiving m (m=integer, $2 \leq m$) inputs of parallel data, and a data output terminal, the multiplexer block converting the parallel data into serial data in response to the first clock signal, an h-th stage including $m^{n-h}$ multiplexer blocks, each multiplexer block comprising a plurality of D flip-flops and having data input terminals for receiving m inputs of parallel data and a clock input terminal for receiving a second clock signal produced by frequency division of the first clock signal, each multiplexer block converting parallel data into serial data in response to the second clock signal, and a multiplexer block in the h-th stage being connected to a multiplexer block in the (h+1)-th stage so that the serial data output from a multiplexer block in the h-th stage is applied as parallel data input to a multiplexer block in the (h+1)-th stage; and a variable delay circuit connected to the data input terminal of each multiplexer block in one of the second to the n-th stages, the variable delay circuit delaying data input by a variable delay time.

8. The multiplexer of claim 3 further including:

means for monitoring data output from the data output terminal of the multiplexer block in the n-th stage; and means for controlling the delay time of the variable delay circuit with a control signal in response to the monitoring.

9. A multiplexer comprising:

an n-th stage as a final stage (n=integer, $2 \leq n$);

h stages (h=integer, $1 \leq h \leq n-1$), the n-th stage including a multiplexer block comprising a plurality of D flip-flops and having a clock input terminal for receiving a first clock signal, a data input terminal for receiving m (m=integer, $2 \leq m$) inputs of parallel data, and a data output terminal, the multiplexer block converting the parallel data into serial data in response to the first clock signal;

an h-th stage including $m^{n-h}$ multiplexer blocks, each multiplexer block comprising a plurality of D flip-flops and having data input terminals for receiving m inputs of parallel data and a clock input terminal for receiving a second clock signal produced by frequency division of the first clock signal, each multiplexer block converting parallel data into serial data in response to the second clock signal, and a multiplexer block in the h-th stage being connected to a multiplexer block in the (h+1)-th stage so that the serial data output from a multiplexer block in the h-th stage is applied as parallel data input to a multiplexer block in the (h+1)-th stage; and a variable delay circuit connected to a data input terminal of each multiplexer block in one of the first to the (n−1) stages or to the clock input terminal of the multiplexer block in the n-th stage, the variable delay circuit delaying the clock input by a variable delay time.

10. A demultiplexer comprising;

a first stage;

i stages (i=integer, $2 \leq i \leq n$ (n=integer, $2 \leq n$), the first stage including a D flip-flop having a clock input terminal for receiving a first clock signal, a data input terminal for receiving serial data, and a data output terminal, the D flip-flop synchronizing the serial data with the first clock signal, an i-th stage including $m^{i-2}$ (m=integer, $2 \leq m$) demultiplexer blocks, each demultiplexer block comprising a plurality of D flip-flops and having a data input terminal for receiving serial data and a clock input terminal for receiving a second clock signal produced by frequency division of the first clock signal, each demultiplexer block converting serial data into m parallel data outputs in response to the second clock signal, a demultiplexer block in the i-th stage being connected to a demultiplexer block in the (i−1)-th stage so that parallel data outputs from a demultiplexer block in the (i−1)-th stage is input to each demultiplexer block in the i-th stage as serial data; and a variable delay circuit connected to the data input terminal of each demultiplexer block in one of the second to the nth stages, the variable delay circuit delaying the data input by a variable delay time.

11. The demultiplexer of claim 10 further including:

means for monitoring data output from the data output terminals of the demultiplexer blocks in the n-th stage; and means for controlling the delay time of the variable delay circuit with a control signal in response to the monitoring.

12. The multiplexer of claim 11 wherein the variable delay circuit comprises:

a plurality of lines respectively comprising different numbers of buffers providing different delay times, the lines being arranged in parallel with each other; and a selector for selecting one of the lines in response to the control signal supplied from the means for controlling the delay time, the selector being connected to the lines and to the means for controlling delay time.

13. The multiplexer of claim 11 wherein the variable delay circuit comprises at least a variable delay buffer connected to the means for controlling the delay time for varying the variable delay time in response to the control signal.

14. The demultiplexer of claim 13 wherein the variable delay buffer comprises a source follower buffer including a current supply transistor in which the delay time is controlled by controlling a gate voltage of the current supply transistor with the control signal supplied from the means for controlling the delay time.

15. A demultiplexer comprising:

a first stage;

i stages (i=integer, $2 \leq i \leq n$ (n=integer, $2 \leq n$)), the first stage including a D flip-flop having a clock input terminal for receiving a first clock signal, a data input terminal for receiving serial data, and a data output terminal, the D flip-flop synchronizing the serial data with the first clock signal, an i-th stage including $m^{i-2}$ (m=integer, $2 \leq m$) demultiplexer blocks, each demultiplexer block comprising a plurality of D flip-flops and having a data input terminal for receiving serial data and a clock input terminal for receiving a second clock signal produced by frequency division of the first clock signal, each demultiplexer block converting serial data into m parallel data outputs in response to the second clock signal, a demultiplexer block in the i-th stage being connected to a demultiplexer block in the (i−1)-th stage so that parallel data outputs from a demultiplexer block in the (i−1)-th stage is input to each demultiplexer block in the i-th stage as serial data; and a variable delay circuit connected to the clock input terminal of each demultiplexer block in one of the second to the nth stages or to the clock input terminal of the D flip-flop in the first stage, the variable delay circuit delaying the clock input by a variable delay time.

16. A demultiplexer comprising:

a first stage;

k stages (k=integer, $2 \leq k \leq n$ (n=integer, $2 \leq n$)), the first stage including a demultiplexer block comprising a plurality of D flip-flops and having a clock input terminal for receiving a first clock signal, a data input terminal for receiving serial data, and a data output terminal, the demultiplexer block converting the serial data into m (m=integer $2 \leq m$) parallel data outputs in response to the first clock signal, a k-th stage including $m^{k-1}$ demultiplexer blocks, each demultiplexer block comprising a plurality of D flip-flops and having a data input terminal for receiving serial data and a clock input terminal for receiving a second clock signal produced by frequency division of the first clock signal, each demultiplexer block converting serial data into m parallel data outputs in response to the second clock signal, a demultiplexer block in the k-th stage being connected to a demultiplexer block in a (k−1)-th stage so that parallel data output from a demultiplexer block in the (k−1)-th stage is input to each demultiplexer block in the k-th stage as the serial data; and a variable delay circuit connected to the data input terminal of each demultiplexer block in one of the second to the nth stages, the variable delay circuit delaying the data input by a variable delay time.

17. The demultiplexer of claim 16 further including:

means for monitoring data output from the data output terminals of the demultiplexer blocks in the n-th stage; and means for controlling the delay time of the variable delay circuit with a control signal in response to the result of the monitoring.

18. A demultiplexer comprising:

a first stage;

k stages (k=integer, $2 \leq k \leq n$ (n=integer, $2 \leq n$)), the first stage including a demultiplexer block comprising a plurality of D flip-flops and having a clock input terminal for receiving a first clock signal, a data input terminal for receiving serial data, and a data output terminal, the demultiplexer block converting the serial data into m (m=integer, $2 \leq m$) parallel data outputs in response to the first clock signal;

a k-th stage including $m^{k-1}$ demultiplexer blocks, each demultiplexer block comprising a plurality of D flip-flops and having a data input terminal for receiving serial data and a clock input terminal for receiving a second clock signal produced by frequency division of the first clock signal, each demultiplexer block converting serial data into m parallel data outputs in response to the second clock signal, a demultiplexer block in the k-th stage being connected to a demultiplexer block in a (k−1)-th stage so that parallel data output from a demultiplexer block in the (k−1)-th stage is input to each demultiplexer block in the k-th stage as the serial data; and a variable delay circuit connected to the clock input terminal of each demultiplexer block in any of the second to the nth stages or to the clock input terminal of the D flip-flop in the first stage, the variable delay circuit delaying the clock input by a variable delay time.

\* \* \* \* \*